(12) United States Patent
Wang et al.

(10) Patent No.: US 11,996,210 B2
(45) Date of Patent: May 28, 2024

(54) TEMPERATURE-TUNED ULTRAFAST X-RAY SHUTTER USING OPTICS-ON-A-CHIP

(71) Applicant: UCHICAGO ARGONNE, LLC, Chicago, IL (US)

(72) Inventors: Jin Wang, Hinsdale, IL (US); Donald Walko, Woodridge, IL (US); Pice Chen, River Forest, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 285 days.

(21) Appl. No.: 17/737,081

(22) Filed: May 5, 2022

(65) Prior Publication Data

US 2023/0343479 A1    Oct. 26, 2023

Related U.S. Application Data

(60) Provisional application No. 63/332,834, filed on Apr. 20, 2022.

(51) Int. Cl.
*G21K 1/04*    (2006.01)
*B81B 3/00*    (2006.01)
*H01J 37/305*  (2006.01)

(52) U.S. Cl.
CPC .............. *G21K 1/04* (2013.01); *B81B 3/0045* (2013.01); *B81B 2201/042* (2013.01); *H01J 37/3056* (2013.01); *H01J 2237/31749* (2013.01)

(58) Field of Classification Search
CPC ...... G21K 1/04; G21K 1/06; G21K 2201/065; G21K 2201/067; B81B 3/00; B81B 3/0045; B81B 2201/033; B81B 2201/042; B81B 2203/0154; B81B 2203/058; H01J 37/3056; H01J 2237/31749
See application file for complete search history.

(56) References Cited

U.S. PATENT DOCUMENTS

| 8,976,933 B2 | 3/2015 | Lopez et al. |
| 9,412,480 B2 | 8/2016 | Lopez et al. |
| 2021/0284526 A1 | 9/2021 | Wang et al. |

*Primary Examiner* — Jurie Yun
(74) *Attorney, Agent, or Firm* — MARSHALL, GERSTEIN & BORUN LLP

(57) ABSTRACT

Typically modulation systems are incapable of performing synchronous modulation for high-energy radiation systems. A method and system for performing high-energy synchronous radiation modulating is described. The method includes providing an oscillatory diffractive element, with the oscillatory diffractive element capable of being oscillated over a range of angles. A radiation source provides radiation to the oscillatory diffractive element. An electrical signal is provided to electrodes that oscillate the oscillatory diffractive element to modulate the radiation. A temperature controller controls the temperature of the oscillatory diffractive element to tune the oscillatory motion of the oscillatory diffractive element.

16 Claims, 17 Drawing Sheets

TEMPERATURE-TUNED ULTRAFAST X-RAY SHUTTER USING OPTICS-ON-A-CHIP

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for manipulating X-ray radiation, and specifically to utilizing diffractive microelectromechanical systems for modulating X-ray radiation.

BACKGROUND

X-rays and X-ray based devices are used to probe wide ranges of materials, and interactions that occur across a broad range of time scales ranging from milliseconds to femtoseconds. For example, X-rays are used for the research and development of next-generation memory devices with denser materials and faster processes for information storage, catalysts responsible for energy conversion, and optogenetic devices used for neurobiological control. Additionally, X-ray probing systems are useful for complete spatiotemporal mapping of materials, which, in turn, is useful for observing relevant processes that occur in solar cell and thermoelectric conversion, fuel cells and batteries, and efficient and clean combustion. A fundamental understanding of ultrafast dynamics of charge-, spin- and atomic-organization in materials is essential to understand various processes, and for controlling these dynamics for achieving a desired function. The availability of synchrotron radiation X-ray sources during the past decade, especially the development of X-ray free-electron-lasers (XFELs), has allowed probing of these various processes with femtosecond to picosecond resolution using magnetic/electric pulse generators or a THz source.

While XFELs with a femtosecond pulse width are extremely effective in probing dynamics on ultrashort time scales, in instances, synchrotron-based X-ray sources may be better suited for observing dynamic spatiotemporal processes of microscopic and mesoscopic details in materials. However, temporal resolution at synchrotron sources is generally limited by the X-ray pulse duration in the range of tens to hundreds of picoseconds. Accessing shorter time scales, for example a few picoseconds, often requires complex and costly modification of the storage ring at the expense of other source characteristics such as intensity and brightness.

Microelectromechanical systems (MEMS) are miniature devices integrated into a vast range of industrial and consumer applications. Optical MEMS are developed for dynamic spatiotemporal control in lightwave manipulation and communication as modulators, switches, multiplexers, spectrometers, etc. However, they have not been shown to function similarly in sub-nm wavelength regimes, namely, with hard x-rays, as high-brilliance pulsed x-rays have proven powerful for addressing challenges in time-domain science, from energy conversion to neurobiological control. While desirable temporal properties of x-ray pulses can be manipulated by optics, conventional x-ray optics are inherently massive in size, and hence, never dynamic. Therefore, there is a need for manipulation of hard x-rays in the sub-nm wavelength regime.

SUMMARY OF THE DISCLOSURE

In an embodiment, disclosed is a method of modulating radiation. The method includes providing an oscillatory diffractive element, with the oscillatory diffractive element capable of being oscillated over a range of angles about a central axis of the oscillatory diffractive element. The method further includes providing radiation to the oscillatory diffractive element, oscillating the oscillatory diffractive element, and modulating the radiation by causing, with the oscillatory diffractive element, diffraction of the radiation at a subset of angles of the range of angles of the oscillatory diffractive element. The method further includes controlling the temperature of the oscillatory diffractive element to tune the oscillatory motion of the oscillatory diffractive element.

In variations of the current embodiment, tuning the oscillatory motion of the oscillatory diffractive element includes tuning one or more of (i) the range of angles of the oscillatory diffractive element, (ii) a frequency of oscillation of the oscillatory diffractive element, (iii) a maximum amplitude of oscillation of the oscillatory diffractive element, or (iv) a phase shift of the oscillatory diffractive element.

In some variations of the current embodiment, controlling the temperature of the oscillatory diffractive element is performed by a temperature controller, wherein the temperature controller includes one or more of a Peltier device or a liquid cooling plate.

In another embodiment, disclosed is a system for performing modulation of radiation. The system includes an oscillatory diffractive element disposed along an optical axis, the oscillatory diffractive element having an oscillation axis about which the oscillatory diffractive element may oscillate over a range of angles. An electrode comb is physically coupled to the oscillatory diffractive element, the electrode comb configured to receive a voltage and rotate the oscillatory diffractive element about the oscillation axis upon receiving the voltage. A temperature controller is thermally coupled to the oscillatory diffractive element, for example, by being in thermal contact with a circuit board adjacent to the oscillatory diffractive element. The temperature controller configured to control a temperature of the oscillatory diffractive element to tune oscillatory motion of the oscillatory diffractive element.

In a variation of the current embodiment, the system further includes a vacuum chamber and the oscillatory diffractive element is disposed inside of the vacuum chamber.

DETAILED DESCRIPTION

Figure 1:
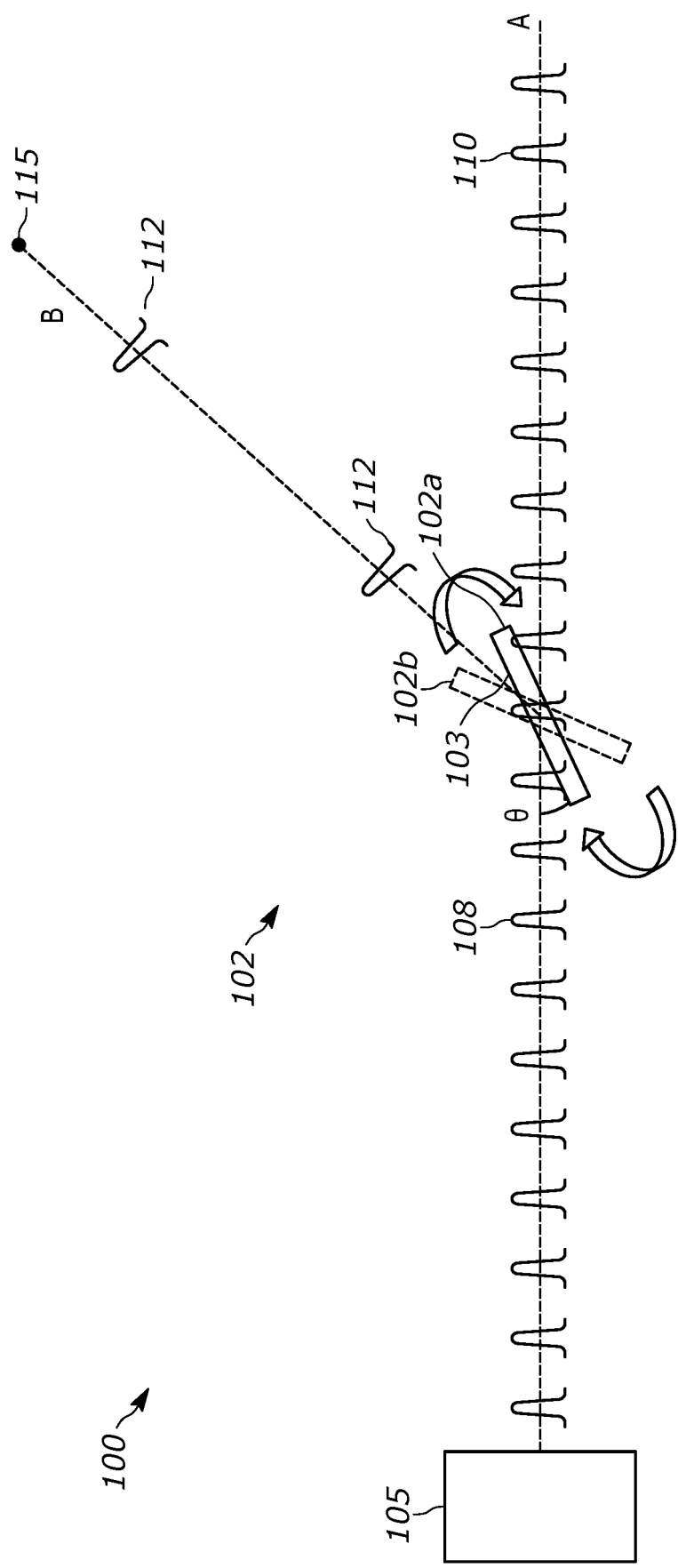
FIG. 1 is a schematic illustration of an example optical setup that implements a MEMS device for performing Bragg-diffraction based X-ray modulation.

X-ray radiation is used across a wide range of fields for a multitude of purposes. X-rays may be used to probe materials for controlling, measuring, and observing chemical, material, and biological processes that may occur on the femtosecond to millisecond time scale. Further, X-ray radiation may be used to probe materials at lengths of picometers to mesoscopic scales. Conventional photonic technologies benefit from the strong interaction between ultraviolet-to-visible-to-infrared light and materials, as many devices exploit nonlinear interactions in ultrafast laser applications and thus enable time-domain measurements and observations. Since the advent of high-brilliance, and high-intensity x-ray synchrotron sources, time-resolved x-ray techniques have become a powerful tool for understanding structures and dynamics in fast-evolving systems that are not accessible by traditional visible-light-based optical methods. Next-generation synchrotron sources, based on multi-bend achromat (MBA) lattices provide a two- to three-order increase in brilliance than previous radiation sources. Correspondingly, the next-generation sources may provide a more than 50-times increase in brightness per pulse, which may be useful for time-resolved experiments using coherent X-rays. However, research requires simultaneous high brilliance (i.e., a measure of radiation quality) of synchrotron sources, while being able to provide tunable and flexible pulse timing (e.g., pulse duration, pulse train period, etc.), which current synchrotron sources are unable to provide. Some current synchrotron sources provide densely packed pulse trains with high repetition rates on the order of 100 to 500 MHz, which provides only a few nanoseconds between pulse trains. Many time-resolved experiments that require well-spaced X-ray pulses are not able to be performed using such tightly packed, high-repetition rate pulse trains. Additionally, a temporal drift of optical components causes phase errors, amplitude, and intensity fluctuations in systems that perform pulse picking, pulse shaping, and other optical processes on high-energy radiation pulse trains.

Currently, there are no systems capable of modulating hard X-rays (i.e., having photon energies greater than 5 keV) at ultrafast time scales on the order of 100s of nanoseconds or faster. Mechanical choppers are typically used for X-ray modulation. Mechanical choppers may include an opening and closing mechanism or a radial chopper that spins to block and transmit pulses of X-ray radiation. The traditional mechanical choppers preserve peak X-ray brilliance, but are extremely limited in chopping and modulation rates due to the mechanical nature of the device. State-of-the-art mechanical choppers are only able to modulate at rates of about 1 MHz for soft x-rays and 10 kHz for hard x-rays, while synchrotron radiation sources require modulation on the order of hundreds of megahertz. Further, mechanical choppers typically have maximum bandwidths of about 6 MHz, which is two orders of magnitude lower than the disclosed MEMS devices. Additionally, mechanical choppers do not provide clean pulse-picking of pulses from a pulse train resulting in pulse distortion, and undesired noise and radiation.

Alternative attempts for manipulating hard X-rays have included modifying synchrotron accelerators themselves. Typically, the accelerator-based strategies involve using an electron kicker or quasi-resonant excitation to steer electrons slightly off from the propagation axis causing debunching of electron bunches. The debunched electrons then generate a pulse that may be picked from a pulse train, with the debunched retaining the spectral distribution of the original radiation beam. The debunching approach described causes an electron or group of electrons to be slightly off path compared to other electrons of the synchrotron. Therefore, the described debunching causes a notable reduction in peak brilliance of the output radiation, making it unfeasible as a high brilliance radiation source. Also, debunching techniques are limited to about a 100 MHz modulating limit due to electron kickers which could cause interference with adjacent bunches of electrons. Currently, soft X-ray beamlines are capable of modulating beams at around 27 MHz, while no such modulation scheme exists for hard X-ray beam lines. Hard x-ray operation using the accelerator approaches is in principle feasible, but not yet demonstrated at any high-energy source.

Presented herein is a device and method for performing radiation modulation of hard X-rays. The device utilizes optics-on-a-chip based microelectromechanical systems (MEMS) to perform ultrafast modulation of the radiation. The MEMS device includes a diffractive surface, and the MEMS device is oscillated using electric potentials. Due to the small dimensions of the MEMS device, the diffractive surface of the MEMS device can be oscillated at much higher frequencies than other mechanical systems. The described device can be oscillated at $10^7$ degrees/sec and has a diffractive time window of 300 ps with a source frequency of greater than 3 GHz. Additionally, presented herein is a method and system for performing temperature tuning of the MEMS device which allows for fine-tuning and control of oscillating amplitude, oscillation frequency, and oscillation phase of a radiation modulator.

The disclosed oscillating MEMS device is able to perform pulse picking of hard X-rays out of pulse trains having a pulse frequency of 352 MHz, and a pulse interval of 2.84 ns, which is about 103 higher than other mechanical modulation devices. Further, the presented device modulates radiation with a pulse purity of greater than 106 without compromising spectral brilliance. The high speed pulse picking disclosed herein may be useful for performing pulse picking of hard X-rays at any existing synchrotron radiation source, without the drawbacks of other mechanical shutters or electron kicking magnets. The MEMS X-ray diffractive apparatus disclosed provides the ability to investigate dynamical processes in biological, chemical and energy materials, and provides a new method to manipulate hard X-ray radiation pulse shapes at present and future X-ray sources, such as XFELs.

FIG. 1 schematically illustrates an example optical setup 100 that implements a MEMS device 102 for performing Bragg-diffraction based X-ray modulation as described herein. The setup 100 includes a radiation source 105 that provides radiation in the form of input pulses 108 along an axis of propagation A. The input pulses 108 are incident of the MEMS device 102 and, depending on an angle of incidence Θ of the MEMS device 102 to the individual input pulses 108, the MEMS device 102 either diffracts the radiation or transmits the radiation according to the laws of Bragg diffraction.

The MEMS device 102 includes a diffractive surface 103, such as a crystal, on which the input pulses 108 are incident. For example, the diffractive surface 103 may be a layer of silicon that is formed by disposing silicon on an insulator, known as silicon-on-insulator (SOI). The insulator may then be removed to leave the silicon layer as the diffractive surface 103. Diffraction of the input pulses 108 is realized by placing the MEMS in the Bragg condition, which depends on the energy of the input pulses 108 and a diffraction plane of the silicon layer. When the diffractive surface 103 of the MEMS device 102 is positioned such that the angle of incidence is equal to a Bragg angle (i.e., $\Theta=\Theta_B$), as illustrated by a first position 102a of the MEMS device 102, the input pulses 108 are diffracted by the MEMS device 102 as diffracted pulses 112. The diffracted pulses 112 propagate along an axis of propagation B to a target 115. The target 115 may be a sample for probing or manipulating, a radiation sensor or detector, or other optics and optical systems for further manipulating the diffracted pulses 112. As one of ordinary skill in the art would understand, the Bragg condition is met when the angle of incidence of radiation is equal to the Bragg angle for a given diffractive element and radiation energy. As such, the discussion of the disclosed system and methods may include satisfying the "Bragg condition" or meeting the "Bragg angle" interchangeably as appropriate.

The MEMS device 102 may be rotated about an axis to position the diffractive surface 103 at an angle less than or greater than the Bragg angle, as illustrated by second position 102b of the MEMS device 102. The input pulses 108 are transmitted, as transmitted pulses 110, through the MEMS device 102 when the angle of incidence of the input pulses 108 is not equal to the Bragg angle, or within a tolerance of the Bragg angle. The transmitted pulses 110 continue to propagate along the optical axis A, and the transmitted pulses may be sent to a sensor, a sample for probing, a beam dump, or another optical setup for performing further manipulation of the transmitted pulses 110. Further, in some examples, the transmitted pulses 110 may be absorbed by a substrate or other elements of the MEMS device 102. Therefore, the input pulses 108 are transmitted through the diffractive surface 103, but do not continue to propagate along the optical axis A, as they are soon after absorbed, either partially or entirely, by a substrate of the MEMS device 102.

Figure 2A:
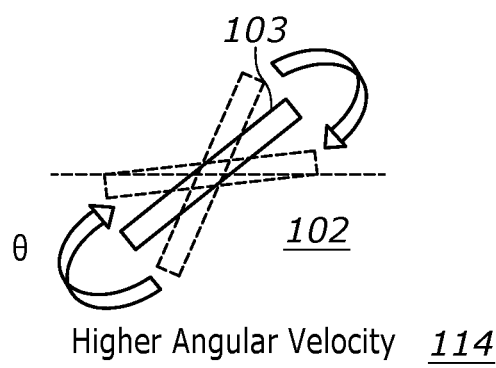
FIG. 2A illustrates a high angular velocity oscillating MEMS device.
Figure 2B:
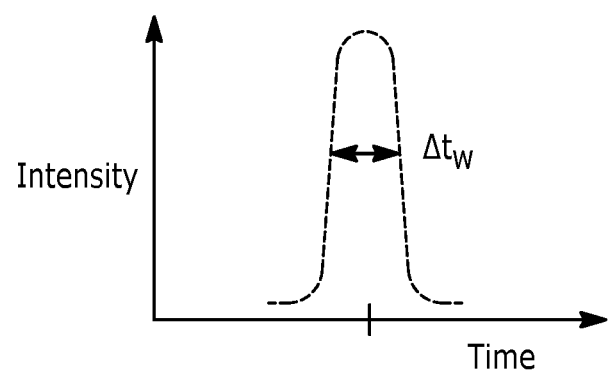
FIG. 2B is a plot of a diffraction time window (DTW) having a short temporal full-width at half-max (FWHM) corresponding to the high angular velocity oscillating MEMS device of FIG. 2A.
Figure 2C:
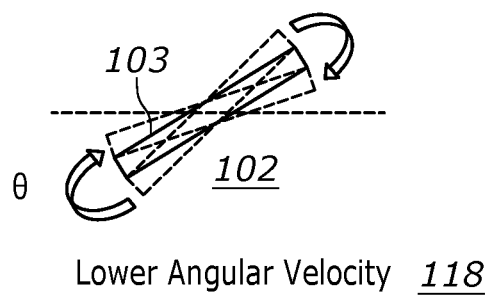
FIG. 2C illustrates a slow angular velocity oscillating MEMS device.
Figure 2D:
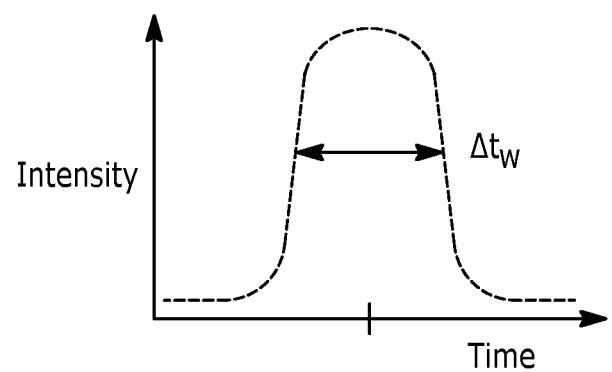
FIG. 2D is a plot of a DTW having a long temporal FWHM corresponding to the slow angular velocity oscillating MEMS device of FIG. 2C.

The angular speed and amplitude of rotation of the diffractive surface 103 of the MEMS device 102 determines the width of the diffractive time window (DTW) over which the Bragg condition is fulfilled. FIGS. 2A and 2B, and FIGS. 2C and 2D, respectively illustrate angular velocity of a diffractive MEMS device, and varied diffractive timing windows for higher and lower angular velocity in accordance with embodiments. FIG. 2A illustrates a scenario of oscillating the MEMS device 102 at a high angular velocity or higher angular rotation amplitude. FIG. 2B is a plot of a DTW having a short temporal full-width at half-max (FWHM) of $\Delta t_w$, with the DTW of FIG. 2B corresponding to the fast and/or high amplitude oscillation illustrated in FIG. 2A. FIGS. 2C and 2D present a respective schematic illustration and plot of a lower angular velocity or lower amplitude oscillation of the MEMS device 102, and a corresponding longer FWHM DTW. By comparing the two time-window widths, $\Delta t_w$, of FIGS. 2B and 2D, it is evident that slowing down, or decreasing the amplitude, of the oscillations of the MEMS device 102 increases the width of the DTW. The width of the DTW is determined by the amount of time that the Bragg condition is met within a certain tolerance of the Bragg angle. Typically, for hard X-rays, and silicon as the diffractive surface, the Bragg condition is met within a few millidegrees of the Bragg angle, or even within half a millidegree, on the order of tenths of a millidegree, on the order of hundredths of a millidegree, or less. FIGS. 2A-2D illustrate the ability to tune the DTW of the diffractive MEMS device by changing the frequency of oscillation, and/or the amplitude of the frequency of oscillation.

Figure 3A:
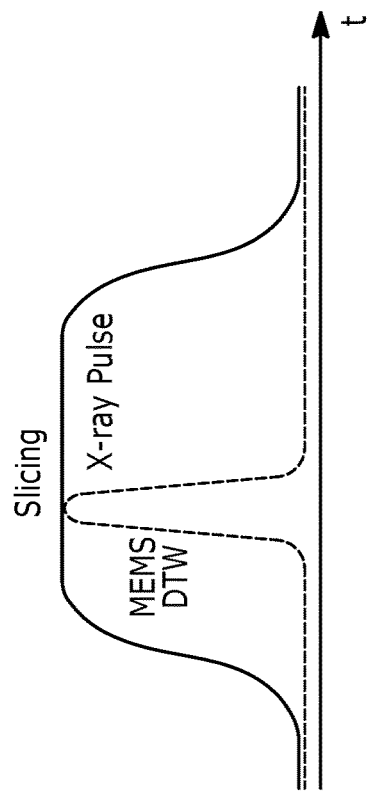
FIG. 3A is a plot of radiation intensity over time for a pulse train showing pulse picking of the pulse train.
Figure 3C:
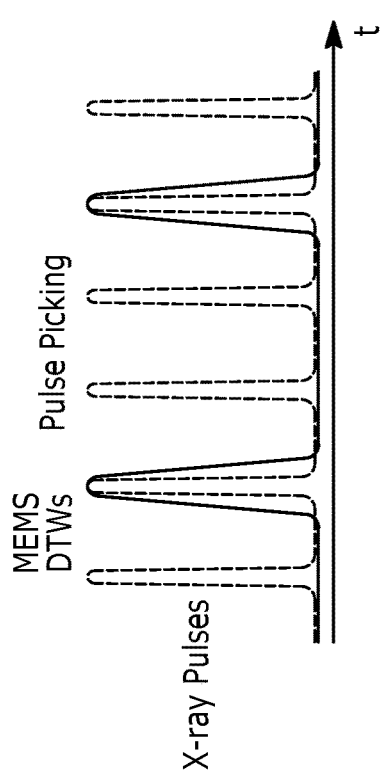
FIG. 3C is a plot of radiation intensity over time for a pulse showing streaking of the pulse.
Figure 3B:
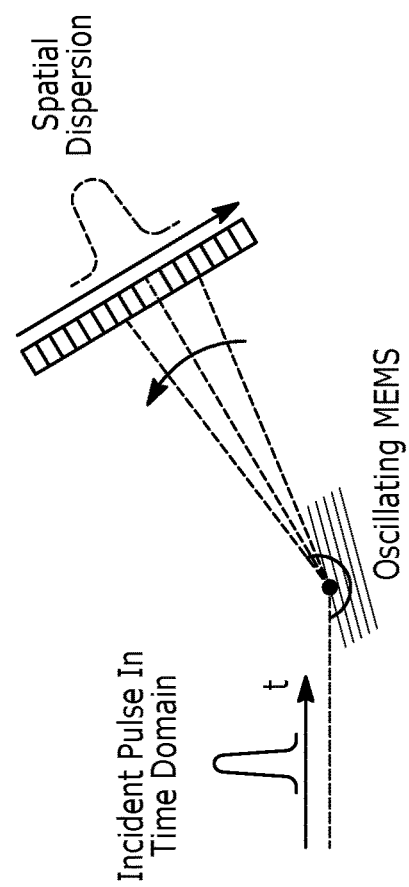
FIG. 3B is a plot of radiation intensity over time for a pulse showing amplitude slicing of the pulse.
Figure 3D:
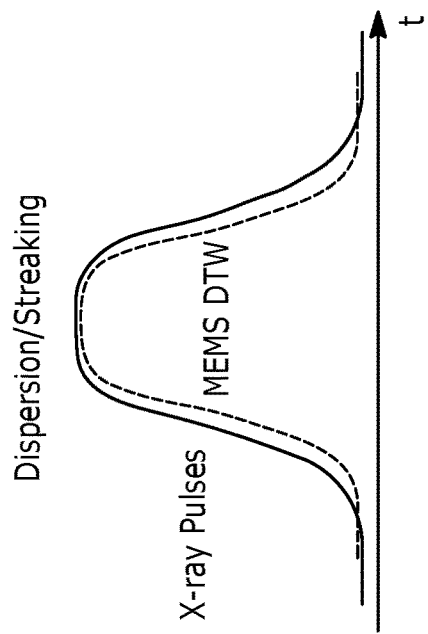
FIG. 3D is a plot of radiation intensity over time for a pulse train and performing spatial dispersion of the pulse train using an oscillating MEMS device.

FIGS. 3A-3D are radiation intensity plots over time illustrating various applications of radiation manipulation using a diffractive MEMS device as disclosed herein. FIG. 3A shows a set of input pulses, and a DTW of an oscillating diffractive MEMS device. The DTW illustrated in FIG. 3A is broader in time than individual pulses of the input pulse train, and therefore the pulses may be picked from the pulse train as illustrated in FIG. 3A. FIG. 3B illustrates pulse slicing, wherein the DTW is narrower in time than an X-ray pulse. Therefore, the diffractive MEMS device only diffracts a portion of the pulse, resulting in a diffracted pulse being only a slice or portion of the input pulse. FIG. 3C shows spatial dispersion/streaking of an X-ray pulse, when the DTW is close to the incoming pulse width. The diffractive MEMS device disperses the pulse in time over the width of the pulse as the MEMS device oscillates through its range of oscillation angles that meet the Bragg condition. FIG. 3D is a schematic showing the spatial dispersion/streaking using a position-sensitive detector (PSD) to detect the different positions of a pulse or multiple pulses diffracted by the MEMS device. As illustrated in FIG. 3D, the oscillating MEMS device converts an input optical beam, such as an X-ray pulse, in the time domain to a spatially dispersed signal that contains time-resolved, sub-pulse information.

As shown in FIGS. 3A-3D, an oscillating diffractive MEMS device may be used to manipulate or modulate radiation for various applications and purposes. The DTW of the MEMS device may be tuned according to a desired application. For example, for pulse modulation or pulse picking, a DTW of a few nanoseconds is sufficient to satisfy the requirements of modulating sub-GHz pulse trains, whereas a shorter DTW may be required for performing pulse dispersion or pulse slicing. In examples, a DTW on the order of hundreds of picoseconds has been achieved with angular oscillation speeds on the order of $10^7$ degrees per second. For example, a DTW of 300 picoseconds has been achieved enabling radiation modulation at rates greater than 3 GHz. Further, as discussed herein, the DTW may be finely tuned by controlling the temperature, and further the oscillation properties (i.e., oscillation amplitude, oscillation frequency, oscillation phase) of a diffractive MEMS device.

Figure 4:
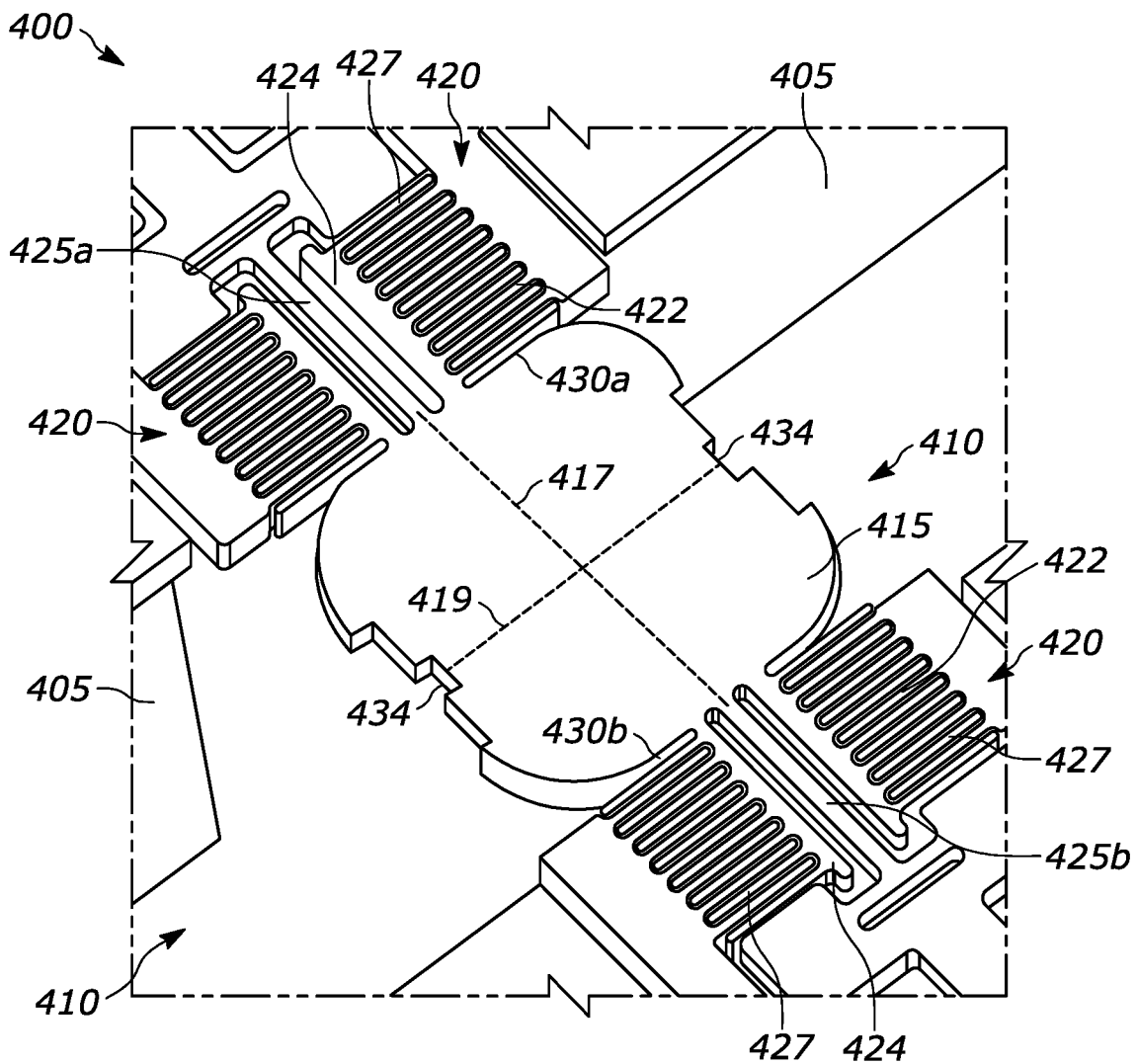
FIG. 4 is a perspective view of a diffractive oscillating MEMS device for performing radiation modulation.

FIG. 4 is a perspective view of a diffractive, oscillating MEMS device 400 for performing radiation modulation. The MEMS device 400 is configured to receive beams of radiation from a radiation source such as a storage ring, free electron laser, undulator, or a synchrotron. The MEMS device 400 includes a substrate 405, a channel 410, a diffractive element 415, two torsional actuators 420, and first and second torsional flexure arms 425a and 425b. The diffractive element 415 has an oscillation axis 417, along which is a width of the diffractive element, about which the diffractive element 415 is displaced (e.g., rotates or oscillates about) and a non-oscillation axis 419 perpendicular to the oscillation axis 417 along which is a length of the diffractive element, and along which the radiation beam propagates.

Elements of the MEMS device, such as the actuators 420, are formed on the substrate 405. In some embodiments, the substrate 405 has the channel 410 etched into it. The diffractive element 415 is suspended above the channel 410 and maintained in a position by the torsional flexure arms 425a and 425b. The diffractive element 415 may be a crystal such as single-crystal silicon, while in embodiments, the diffractive element 415 may be a crystal fabricated from one or more of germanium, silicon-germanium, silicon-carbide, diamond, a multi-layer of material as a grating, or any other material used for fabricating a crystal for a MEMS device.

The first torsional flexure arm 425a is physically coupled to a first end 430a of the diffractive element 415. The first torsional flexure arm 425a is also physically coupled to the substrate 405 to provide physical support to the first torsional flexure arm 425a and the diffractive element 415. The second torsional flexure arm 425b is physically coupled to a second end 430b of the diffractive element 415, with the second torsional flexure arm end 425b being on an opposite side of the diffractive element 415 than the first torsional flexure arm end 425a. The second torsional flexure arm 425b also physically coupled to the substrate 405 to provide physical support to the first torsional flexure arm 425a and the diffractive element 415. In some embodiments, the first and second torsional flexure arms 425a and 425b are collinear along the oscillation axis 417, or parallel to the oscillation axis 417. In some embodiments, the first and second torsional flexure arms 425 may include one or more torsional springs.

Each of the torsional actuators 420 includes a driving electrode comb 422 electrically coupled to a power source to provide a voltage to the driving electrode comb 422. The torsional actuators 420 further include rotatable electrode combs 427 having electrodes disposed between electrodes of the driving electrode comb 422. As illustrated in FIG. 4, electrodes of the rotatable electrode comb 427 are interdigitated between electrodes of the driving electrode comb 422. Each electrode of the rotatable electrode combs 427 is physically supported by a beam 424 that is physically coupled to the diffractive element 415 on either the first or second end 430a or 430b. Further, each rotatable electrode comb 427 is electrically coupled, through the beams 424 and the torsional flexure arms 425a and 425b, to a power source to provide a voltage to the rotatable electrode combs 427. Therefore, the rotatable electrode combs may rotate about the rotation axis 417 when a voltage is applied between the driving electrode combs 422 and the rotatable electrode combs 427. In some embodiments, the rotatable electrode combs 427 are directly physically coupled to the torsional flexure arms 425a and 425b. Each torsional actuator 420 is an inter-digitated capacitor for applying a torque to the diffractive element 415 for controlling a rotation and orientation of the diffractive element 415. While shown in FIG. 4 as including four torsional actuators 420, in other embodiments, the MEMS device 400 may include a single torsional actuator, two torsional actuators, or another number of torsional actuators for controlling a rotation and/or orientation of the diffractive element 415.

In operation, a radiation source provides radiation to the diffractive element 415 of the MEMS device 400. For example, a radiation source may provide X-ray pulses to the diffractive element 415. A power source provides an electrostatic force to the driving electrode combs 422 and rotatable electrode combs 427. Providing a voltage between driving electrode combs 422 and rotatable electrode combs 427 allows for the control of the orientation of the diffractive element 415 and to rapidly adjust its orientation about the oscillation axis 417. In some embodiments, a power source may provide an AC signal to the driving electrode combs 422 and rotatable electrode combs 427 to rapidly adjust the orientation of the diffractive element 415 by oscillating the diffractive element 415 about the oscillation axis 417 at a given AC frequency. As the orientation of the diffractive element 415 is altered about the oscillation axis 417, the torsional flexure arms 425a and 425b provide a mechanical counter-torsional force against the electrically driven rotation of the diffractive element 415. The diffractive element 415 may be oscillated at a frequency that matches, or nearly matches, the pulse frequency of the optical beam. For example, the diffractive element 415 may be oscillated at a frequency that is within ±10% of the value of a pulse frequency, or oscillated at sub-harmonic frequencies or higher harmonic frequencies of the applied radiation or beam.

Typical MEMS devices cannot perform high-speed modulation of hard X-ray radiation because normally the oscillations of a diffractive MEMS device are not synchronized with the frequencies of the radiation. MEMS devices with a quality factor (Q) exceeding 103 have an extremely narrow resonant bandwidth, and therefore it is very difficult for an as-fabricated MEMS device to have a resonant frequency that coincides with a storage-ring frequency or other high-energy radiation source frequencies. For example, an unmatched, or asynchronous, diffractive MEMS device relies on the chance to diffract an X-ray pulse during pulse-picking, while a frequency matched (i.e., synchronous) device increases the efficiency of pulse-picking of hard X-rays by factors on the order of $10^5$ to $10^7$. Additionally, synchronous devices are 1,000 to 10,000 faster than asynchronous devices. As such, an asynchronous device cannot be an effective X-ray optic at a light source that produces periodic pulses. Additionally, the long-term synchronicity of a MEMS device to a radiation source is often unachievable due to oscillation property shifts due to pressure and temperature fluctuations during operation. Presented herein are methods and systems that enable synchronized operation of a diffractive MEMS device with high-frequency radiation sources using mass, pressure, electrical control, and temperature tuning of the MEMS device.

In order to tune the frequency of the MEMS device 400 to the frequency of a synchrotron ring or other radiation source, one or more notches 434 may be formed (e.g., etched) into the diffractive element 415 to change the overall mass of the diffractive element 415. In some embodiments, the notches 434 are formed on multiple edges of the diffractive element 415 that are parallel to the oscillation axis 417 and orthogonal to the non-oscillation axis 419. In some embodiments, multiple tiers of notches may form a notch such as the tiered notches 434 illustrated in FIG. 4. The notches 434 may be formed using photolithography and/or other etching procedures, which may include wet etching, dry etching, reactive ion etching, deep reactive ion etching, laser etching or any other procedure for etching. In some embodiments, a highly precise frequency trimming process based on focused ion beam ("FIB") techniques (e.g. focused ion beam etching) may be used to form the notches 434. Reducing the mass of the diffractive element changes the frequencies at which the diffractive element may be oscillated. For example, as the mass of the diffractive element 415 is reduced, the overall resonant frequency of the diffractive element 415, and rotations thereof, may be increased.

Figure 5:
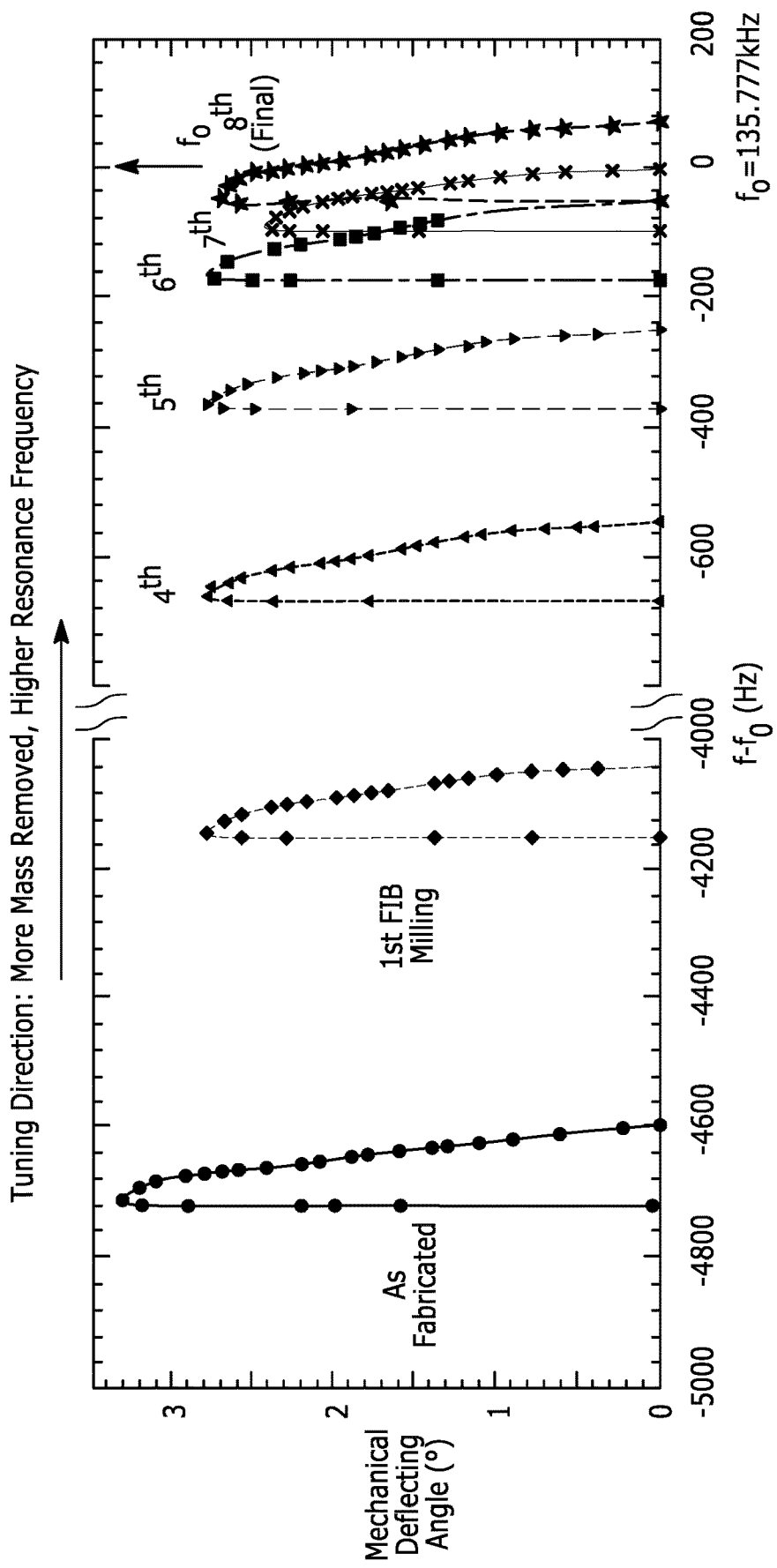
FIG. 5 is a plot of resonant oscillating frequency bands for a MEMS device with different masses.

FIG. 5 is a plot of resonant oscillating frequencies for a diffractive MEMS device having different masses. A MEMS device was fabricated having a silicon crystal as the diffractive element 415. The silicon crystal was 25 µm thick, 250 µm wide (i.e., along the oscillation axis 417), and had a 250 µm length (i.e., along the non-oscillation axis 419). The total mass of the silicon crystal, as fabricated, was approximately 3600 ng with a resonant frequency of approximately 131.077 kHz. The silicon crystal underwent several cycles of etching, slowly increasing the size of the notches etched out of it to fabricate a MEMS device with a diffractive element of progressively different mass, and accordingly, different resonant frequency. As mass was removed, the resonant frequency of the diffractive MEMS device was increased by 4.8 kHz and the Q factor was about 1000±100.

The tuning by controlling the mass of the diffractive element 415 allows for coarse tuning of a device's resonant oscillating frequency. Further fine-tuning of the device's resonance frequency is required for performing high-speed (i.e., >100 MHz) modulation of hard X-ray beams. Additionally, the mechanical etching is a permanent change to the diffractive element 415 causing the resonant frequency of the MEMS device to be permanently shifted to a higher frequency. Currently, removing mass from the diffractive element 415 by focused ion beam (FIB) milling is the only method for tuning a resonant frequency of the oscillatory diffractive element. FIB milling of the diffractive element only allows for increasing the resonant frequency of oscillation, and FIB milling is a laborious process that requires expensive equipment and hours of milling and test time.

As described herein, fine-tuning of the resonant oscillating frequency of a diffractive MEMS device may be implemented for achieving synchronous operation of a MEMS device with a synchrotron radiation source, at frequencies of 352 MHz, or faster. Fine-tuning of a diffractive MEMS device includes controlling the atmospheric pressure applied to, and temperature of, the MEMS device.

The DTW of an oscillating diffractive MEMS device is determined by multiple contributing factors. The temporal width of a DTW for a MEMS device, as described herein, is determined by $$t_w = \frac{\Delta\theta_{(hkl)}}{2\pi f\alpha}, \quad \text{EQ. 1}$$

where $\Delta\theta_{(hkl)}$ is a rocking curve width of Bragg reflection for a given crystal type, and the bottom part of the right side being equal to a maximum achievable angular velocity ($\dot{\theta}$)=$2\pi f\alpha$ with f being the resonant frequency of the diffractive element, and α being an amplitude of the oscillation. By changing the pressure of the environment, and temperature of the device, the amplitude of oscillation may be increased allowing for a narrower DTW. In examples herein, the minimum temporal width of the DTW was typically between 0.5 and 1 ns. In other examples, the width of the DTW may be on the order of tenths of nanoseconds, on the order of nanoseconds, or longer than 10 nanoseconds depending on the radiation pulse timing and application (e.g., pulse picking, dispersion, etc.).

Typically, the amplitude and resonant frequency of an oscillating device are limited by the pressure of the environment that the device is disposed in, and the temperature of the oscillatory diffractive element. The temperature of a material such as silicon, affects Young's modulus of the silicon. Young's modulus provides a measure of elasticity of a material, which, for the uses herein, affects the torsional resonant frequencies and oscillatory modes of an oscillatory diffractive element. Previously, temperature-induced effects of materials have been considered to have adverse impacts on device performance due to reduced operation stability and reduced repeatability of measurements or desired performance standards. For other systems that use oscillatory elements, temperature-induced effects can also cause material failures resulting in broken parts and devices, which causes increased financial cost and increased time to get a system back online.

The device disclosed herein operates in a controlled oscillation mode having an oscillation frequency fixed at a subharmonic of a synchrotron RF frequency. Operating at a sub-harmonic of the synchrotron frequency allows for synchronous operation of oscillating diffractive MEMS device with the synchrotron source. Synchronous operation allows for improved performance of radiation modulation for various applications. For example, in pulse picking, the synchronous operation allows for more precise pulse picking, which reduces noise due to other nearby pulses, and preserves pulse shape during modulation. Further, in pulse shaping synchronous operation of the oscillating diffractive MEMS device allows for more accurate modulation and shaping of pulse intensity. The oscillating diffractive MEMs devices disclosed are operated with a radiation pulse train in a phase-locked and time-averaged mode. For time-resolved experiments, only the synchronous operation as described can ensure a given time resolution when synchronization jitter is controlled to minimum. Therefore, certain pulse modulation process (i.e., pulse picking, pulse shaping, etc.) are only able to be performed for high-speed pulse trains using synchronous operation.

Figure 13:
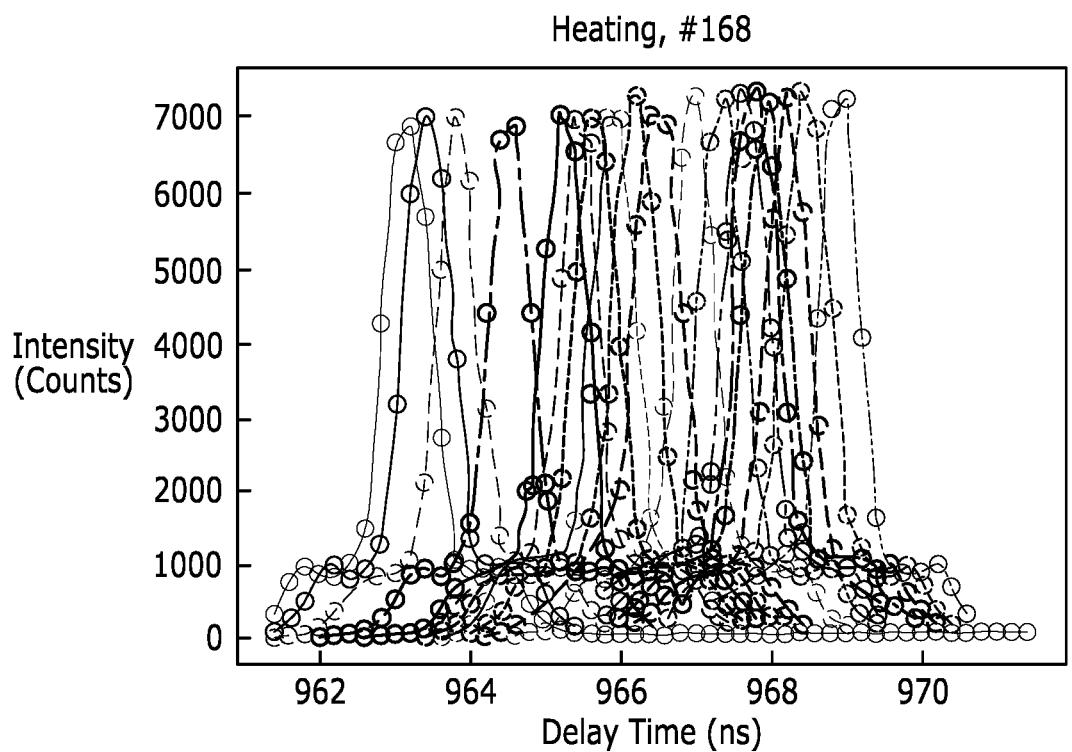
FIG. 13 is a plot of detected radiation intensity versus delay time for various temperatures of a MEMS device at an oscillation frequency of 271.55 kHz.
Figure 14:
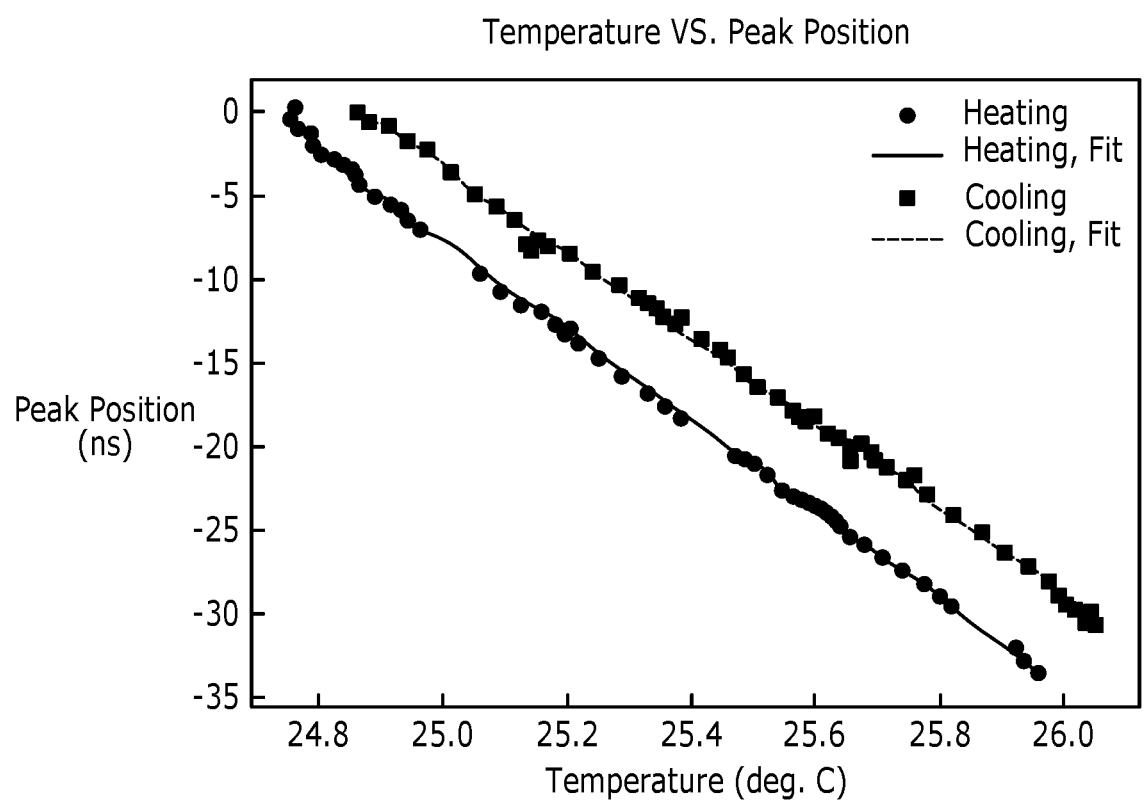
FIG. 14 is a plot of time shift of peak oscillation angle rotation of a diffractive element versus temperature.

The temperature of a material of a diffractive element affects more than the oscillating frequency of the diffractive element, oscillation phase is also affected by temperature of a material. Typically phase variations of an oscillating element are not easily or readily measured or monitored. Presented herein, and further discussed in reference to FIGS. 13 and 14, are x-ray measurements of oscillation phase that provide ultrafast, ultrasensitive, and ultraprecise diagnostic methods for determining oscillation phase and further tuning the oscillation phase using temperature and/or pressure control. Temperature can further be used to actively tune the MEMS based oscillating diffractive element to achieve long-term operation stability through feedback loops.

Figure 6:
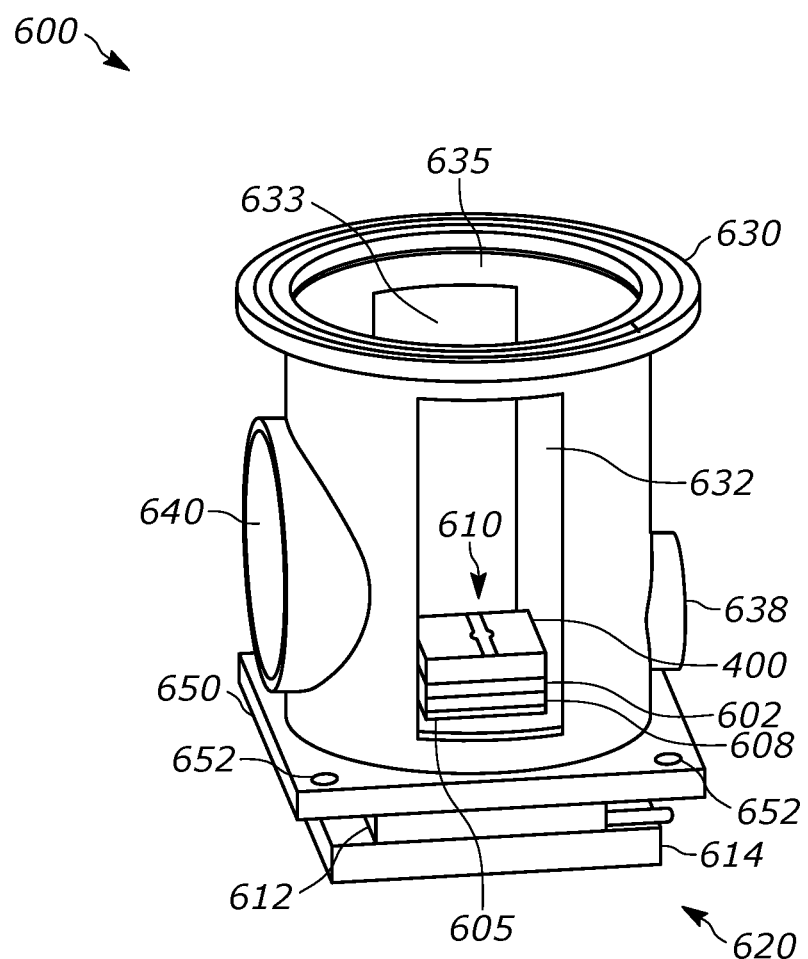
FIG. 6 is a perspective view of a system for performing radiation intensity modulation using an oscillating diffractive MEMS device.

FIG. 6 is a perspective view of a system 600 for performing radiation intensity modulation as described herein. The system 600 includes a vacuum chamber 630 having an internal stack 610 disposed inside of the chamber 630, and an external stack 620 of elements disposed outside of the chamber 630. The internal and external stacks 610 and 620 include elements for controlling the operation of, and the temperature of, an oscillating diffractive MEMS device 400 disposed in the chamber 630. The internal stack includes a circuit board 602 in electrical communication with the oscillating diffractive MEMS device 400. During operation, the circuit board 602 provides voltages to various electrodes and/or electrode combs of the oscillating diffractive MEMS device 400 to cause oscillation of an oscillating element of the oscillating diffractive MEMS device 400.

The internal stack 610 further includes a heat reservoir 608 and a first temperature controller 605. The first temperature controller 605 is thermally coupled to the heat reservoir 608 with the heat reservoir being a heat dump to control the temperature of the oscillating diffractive MEMS device 400. The first temperature controller 605 may include one or more thermoelectric coolers or heaters. For example, the first temperature controller may include a Peltier cooler or heater. In examples, the first temperature controller 605 may be another cooling or heating device disposed inside of the chamber 630 such as a resistive heater, or the first temperature controller 605 may provide heating or cooling to the MEMS device 400 from external to the chamber, for example a laser beam focused onto the MEMS device from a laser source disposed outside of the chamber 630.

The heat reservoir 608 may be a block of material, a finned heat sink, a pin heat sink, or another type of heat sink as required. Further, the heat reservoir 608 may be composed of aluminum, aluminum alloy, copper, copper alloy, or another material having a desired thermal conductivity.

The external stack 620 includes a second temperature controller 612 and a heat sink 614. The second temperature controller 612 is thermally coupled to a bottom plate 650 of the chamber 630 to provide cooling or heating to the bottom plate 650. The second temperature controller 612 is further thermally coupled to the heat sink 614 to allow for heat energy to flow between the bottom plate 650, the second temperature controller 612, and the heat sink 614. The second temperature controller may be a thermoelectric device such as a Peltier cooler or heater. In examples, the second temperature controller 612 includes at least one liquid cold plate that utilizes fluid flow to carry heat away from the bottom plate 650. The heat sink 614 may be a block of material, a finned heat sink, a pin heat sink, or another type of heat sink as required. Further, the heat sink 614 may be composed of aluminum, aluminum alloy, copper, copper alloy, diamond, or another material having a desired thermal conductivity.

The chamber 630 includes a plurality of ports for providing electrical connections to the internal stack 610, and for providing radiation into and out of the chamber 630. The chamber 630 includes an electric feedthrough 640 through which electrical wires and cables may provide electrical communication between devices and elements inside of the chamber 630 to power sources, processors, and other systems external to the chamber 630. An x-ray window 632 allows for x-ray radiation to enter the chamber 630 for performing modulation of the x-ray radiation. An exit window 633 allows for x-ray radiation to exit the chamber 630. For example, during pulse picking, pulses that are not picked from a given pulse train may be attenuated by the MEMS holder, in the current example, or may exit the chamber 630 through the exit window 633 with a specially designed mounting board. The modulated radiation may also exit through a different portion of the exit window 633 at an angle different than that of the non-modulated radiation. The modulated radiation may then be provided to a sample to probe and study the sample that is external to the chamber 630. An optical window 635 allows for access of a laser beam such as a Class-2 laser beam to enter the chamber 630. The laser beam is used to visually measure the oscillations of the MEMS device directly. The windows may be an optical glass plate with, or without, an antireflection coating. Further, the windows 632, 633, and 635 may include a polyimide film that is X-ray transparent. In examples, the polyimide film may be less than 50 microns thick, on the order of tens of microns thick, or 25 microns thick. Window 635 may be composed of an optical glass to allow the Class-2 laser beam access for detecting the MEMS oscillation. The bottom plate 650 may include mounting holes 652 to provide a means for mounting the chamber 630 onto a surface in a desired position. For example, optical mount screws or bolts may be used to mount the bottom plate 650 to an optical table or optical breadboard for operation.

The chamber 630 may further include a pressure pump port 638 that provides fluid communication between the inside of the chamber 630 and a pressurizing pump (not illustrated). The pressurizing pump may be an oil-free diaphragm pump, or another pump capable of controlling the pressure of the inside of the chamber 630.

Figure 7:
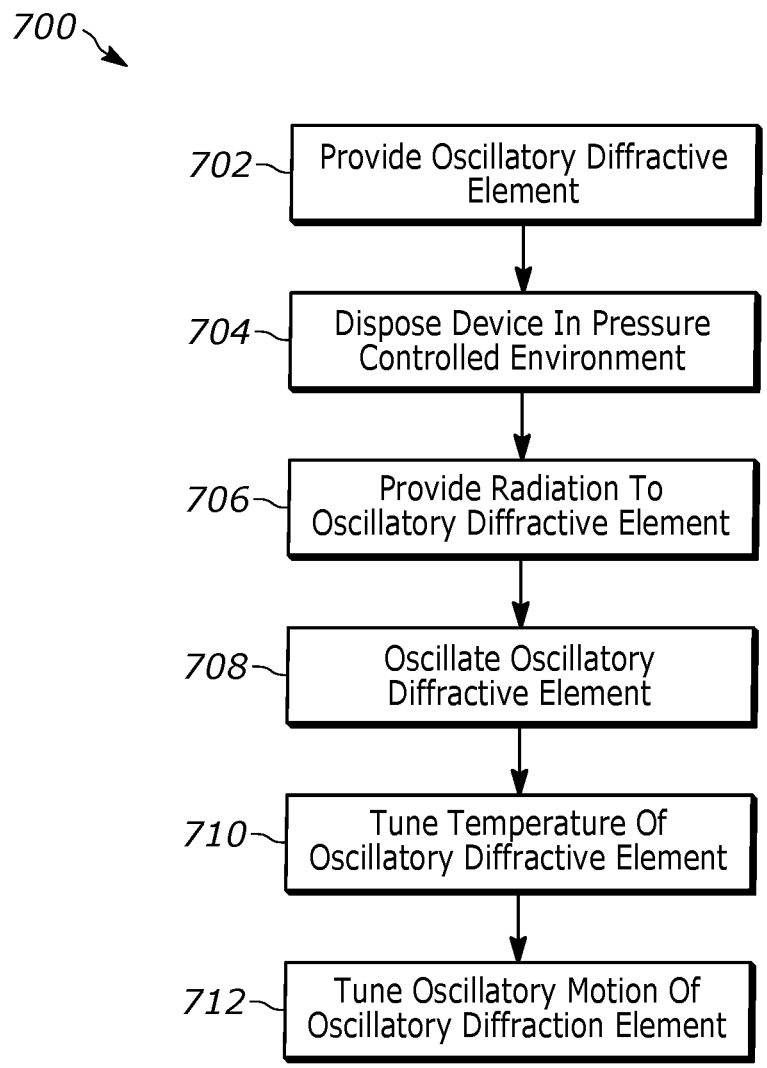
FIG. 7 is a flow diagram of a method for fine tuning a diffractive MEMS device for performing synchronous radiation modulation of hard X-rays.

FIG. 7 is a flow diagram of a method 700 for fine-tuning a diffractive MEMS device for performing synchronous radiation modulation of hard X-rays. To provide clarity the method 700 will be discussed with reference to elements of FIGS. 4 and 7. The method 700 includes providing an oscillatory diffractive element, such as the diffractive element 415 of FIG. 4 (block 702). As previously described, the diffractive element 415 may oscillate through a range of angles about a central axis of the diffractive element 415 for diffracting radiation. The method 700 further includes disposing the diffractive oscillatory MEMS device 400 in a pressure-controlled environment, such as in the chamber 630 in the system 600 of FIG. 6 (block 704).

A radiation source provides radiation to the oscillatory diffractive element 415 (block 706). The radiation source may provide the radiation to the oscillatory diffractive element 415 through the x-ray window 632 of the chamber 630. The radiation source may be a storage ring, X-ray free-electron laser, a synchrotron, or another high-energy radiation source. Voltages are applied to electrode combs 422 and 427 to oscillate the oscillatory diffractive element 415 (block 708). The oscillatory diffractive element 415 diffracts the radiation at a subset of angles of the range of angles of the oscillatory diffractive element 415, with the subset of angles being angles that meet the Bragg diffraction condition as previously described.

The method further includes controlling a temperature of the oscillatory diffractive element 415 (block 710). The temperature is controlled by the first temperature controller 602, and/or the second temperature controller 612. In instances either of the temperature controllers 602 or 612 may be active, or both temperature controllers 602 and 612 may be active in controlling the temperature of the oscillatory diffractive element 415. Controlling and tuning the temperature of the oscillatory diffractive element 415 further tunes the oscillatory motion of the oscillatory diffractive element 415 (block 712). The temperature may be controlled to tune one or more oscillatory motion properties such as a range of angles of oscillation of the oscillatory diffractive element 415, a frequency of oscillation, a maximum oscillation amplitude, and/or a phase shift of oscillation.

Figure 8:
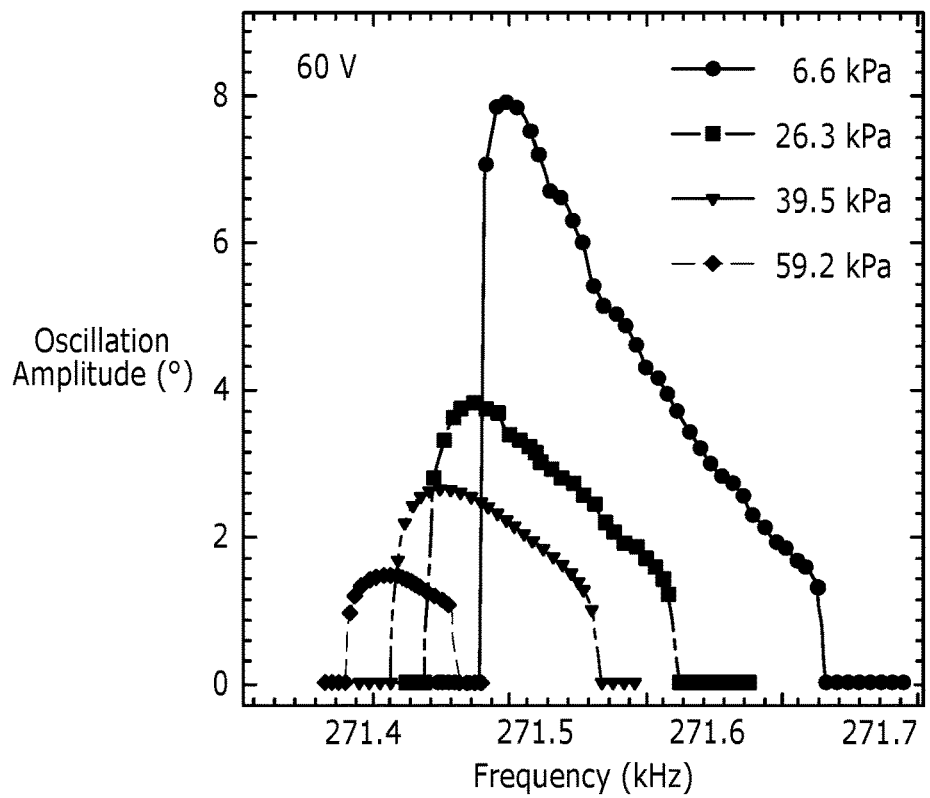
FIG. 8 is a plot of oscillating amplitude versus oscillation frequency of a diffractive element for different environmental pressures inside of a vacuum chamber.

FIG. 8 is a plot of oscillation amplitude, also referred to as deflection angle, of a diffractive element versus oscillation frequency for various environmental pressures inside the chamber 630. The data shows an increase in the overall oscillating frequency of the oscillatory diffractive element as pressure is increased. Additionally, the band of oscillation frequencies broadens and the maximum deflection angle increases with decreased pressure.

Figure 9:
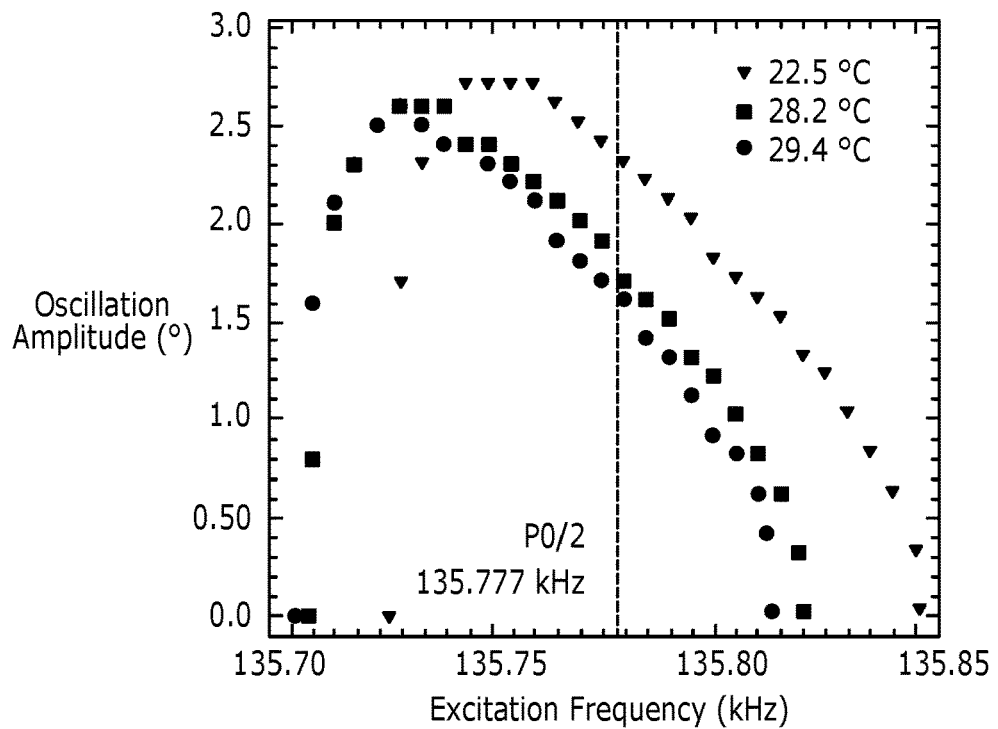
FIG. 9 is a plot of oscillation amplitude versus electrical excitation frequency for an oscillating MEMS device at different temperature.

FIG. 9 is a plot of the oscillation amplitude versus electrical excitation frequency for various temperatures of an oscillating diffractive element. The excitation frequency is the AC electrical signal provided to frequency combs of the diffractive MEMS device, which is half of the diffracted pulse frequency because the oscillatory diffractive element 415 diffracts X-ray pulses twice in each oscillatory period according to the Bragg condition. The data of FIG. 9 shows that the oscillating frequency supported by the oscillating diffractive element decreases with increased temperature. The temperature tuning described herein, and demonstrated by the data of FIG. 9 enables fine-tuning of the oscillation frequency of an oscillatory diffractive MEMS device. For example, tuning of about 3 Hz/K is achieved with a tuning resolution of a fraction of a Hz (i.e., tenths or hundredths of a Hz). The temperature can be controlled to 0.5 K with a stability of 0.1 K in some embodiments. The data presented in FIG. 9 also shows that the oscillation amplitude of the MEMS device increases, for a given oscillation frequency, with decreased temperature. Therefore, at lower temperatures the MEMS device oscillates through the Bragg condition at a faster rate resulting in a narrower DTW. A single period of oscillation is completed in less than 10 microseconds, and the temperature tuned time delay of the device can be on the order of nanoseconds, to tens of nanoseconds. Therefore, the delay can be temperature fine tuned by around 1% increments of a complete period of oscillation, which is correspondingly a 1% phase angle tuning resolution capability.

Figure 10:
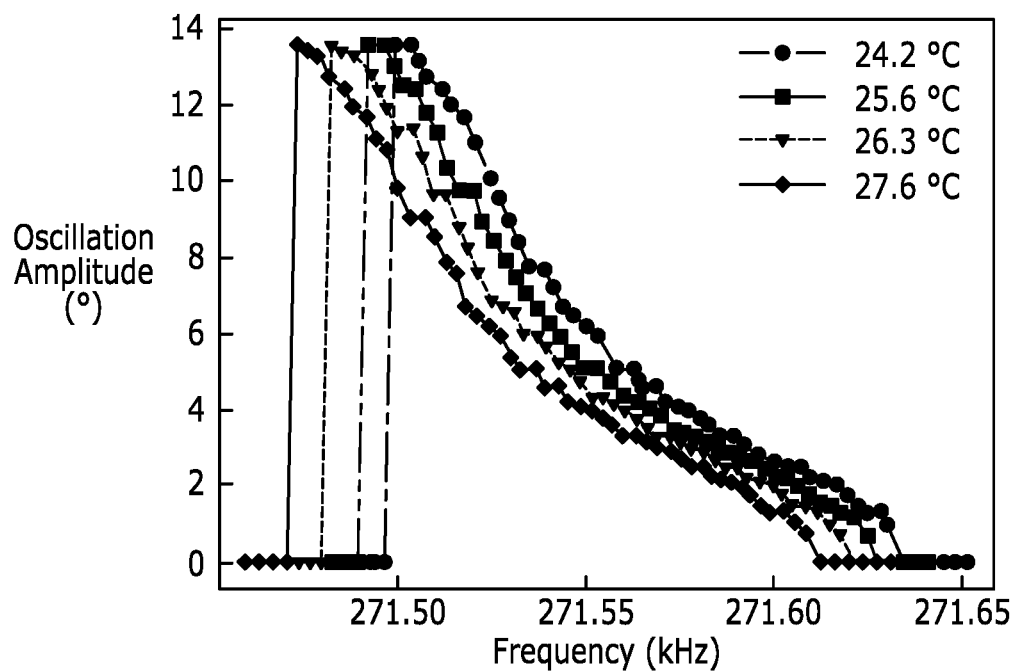
FIG. 10 is a plot of temperature dependent oscillation amplitude versus oscillation frequency for an oscillatory diffractive MEMS device.

FIG. 10 is a plot of temperature dependent oscillation angle versus oscillation frequency for an oscillatory diffractive MEMS device. The data presented in FIG. 10 shows oscillation frequencies around the operational pulse train frequency of some synchrotron devices at 271.55 kHz. The data shows that the oscillation amplitude changes significantly within the 3.4° C. temperature change during the shift of the overall turning curve. For example, the oscillation amplitude exhibits about a 50% change in the 4 to 6° C. range.

Figure 11:
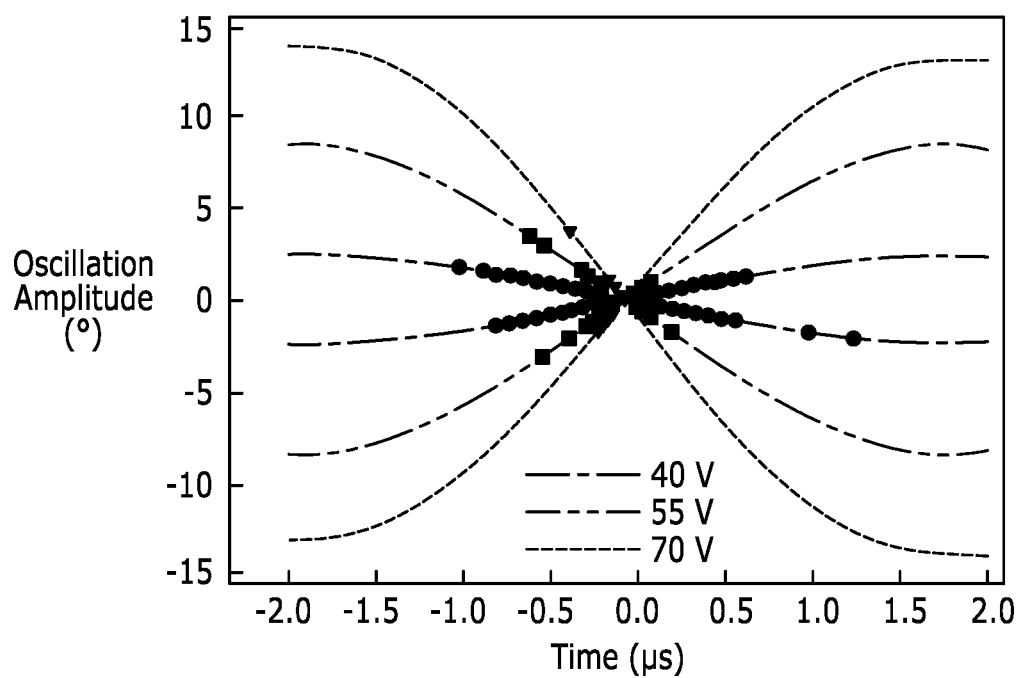
FIG. 11 is a plot of oscillation amplitude versus time under AC excitation signals at 271.55 kHz having various amplitudes.

FIG. 11 is a plot of oscillation angle versus time under different amplitude AC excitation signals at 271.55 kHz. The Bragg condition is met twice in one oscillation cycle, but the separation between the times that the Bragg condition is met depends on $\theta_0$ of the MEMS device. The data of FIG. 11 shows that during one period of the oscillation (i.e., about 3.683 μs) precise oscillation amplitude tuning up to 14.5° may be achieved by varying the voltage of the excitation signal. While three voltage amplitudes are presented in FIG. 11, other voltages at intervals of 1 V, 0.1 V, or of 0.01 V may be applied to achieve a desired oscillation deflection angle.

Figure 12:
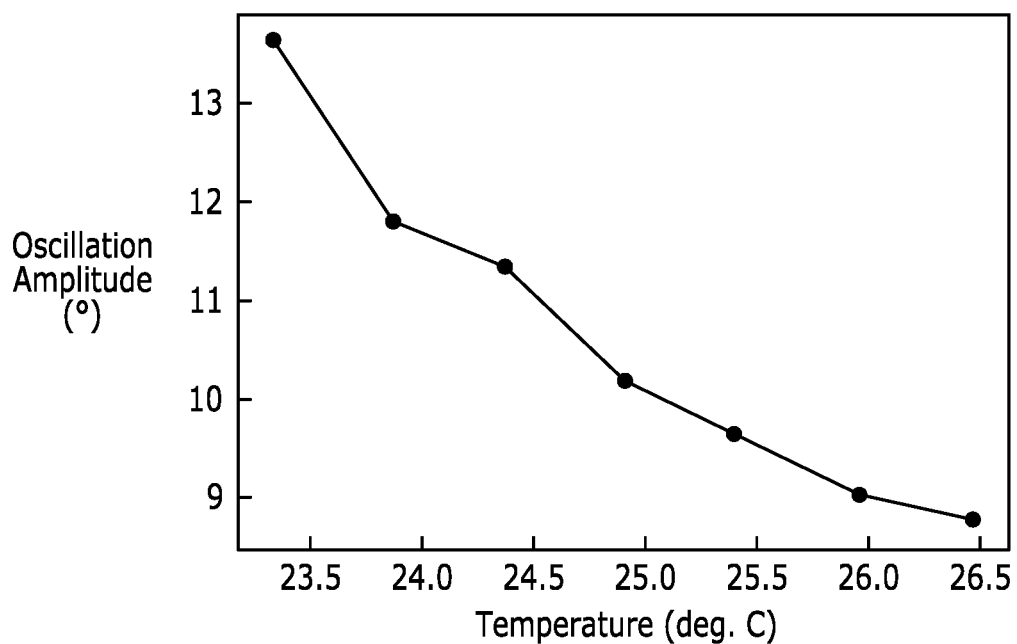
FIG. 12 is a plot of oscillation amplitude versus temperature for an oscillatory diffracting MEMS device at an oscillation frequency of 271.55 kHz

FIG. 12 is a plot of maximum oscillation angle versus temperature for an oscillatory diffracting MEMS device at an oscillation frequency of 217.55 kHz. The MEMS device was driven with a 60 V excitation signal in a 3.8 torr pressurized environment. The temperature range spanned from 23.3° C. to 26.5° C. The oscillation amplitude decreased from 13.6° to 8.8° over the spanned temperature range. The data of FIG. 12 shows that the DTW of the MEMS device can vary by about 50% showing that temperature tuning may be an effective method of tuning diffractive window width over a wide range without changing the excitation voltage.

As discussed previously, performance of a MEMS x-ray optic is directly determined by both the oscillation amplitude and the phase. The oscillating amplitude is indicative of a temporal resolution of the device, while the phase indicates stability and stable operation of the device. FIG. 13 is a plot of detected radiation intensity versus delay time for various temperatures of the MEMS device at an oscillation frequency of 271.55 kHz. The delay is a phase difference between the excitation signal and a radio-frequency signal from a storage ring. The delay determines the timing of the arrival x-ray pulse and the incident angle of the pulse impinging onto the MEMS device. The peak intensity of each curve is indicative of a corresponding peak oscillation angle position of the oscillating diffractive element. The data of FIG. 13 shows that the delay time between the electrical excitation and the maximum oscillation angle decreases with increased temperature. The overall temperature range of the curves in FIG. 13 is 1.2° C. (i.e., from 24.8 to 26° C.).

FIG. 14 is a plot of the time shift of when an oscillatory diffractive element reaches its peak oscillatory angle versus temperature. The two curves present measured times during heating and cooling of the MEMS device. During both heating and cooling of the device, the timing of the peak oscillation amplitude shifts by about 35 ns which corresponds to a 1.5 mrad, or 0.55°, phase shift. The phase shift versus temperature curves follow an approximately linear relationship during both heating and cooling. The MEMS device does exhibit a small hysteresis between heating and cooling, of about 5 ns or 0.2° C. The hysteresis may be due to the system not being in perfect thermal equilibrium during the ramping of the heating or cooling process. The temperature sensitivity of the phase shown by the data of FIGS. 13 and 14 shows that tuning the temperature provides a means for an effective feedback mechanism that ensures a highly stable operation of a MEMS-based x-ray optical modulator.

Figure 15:
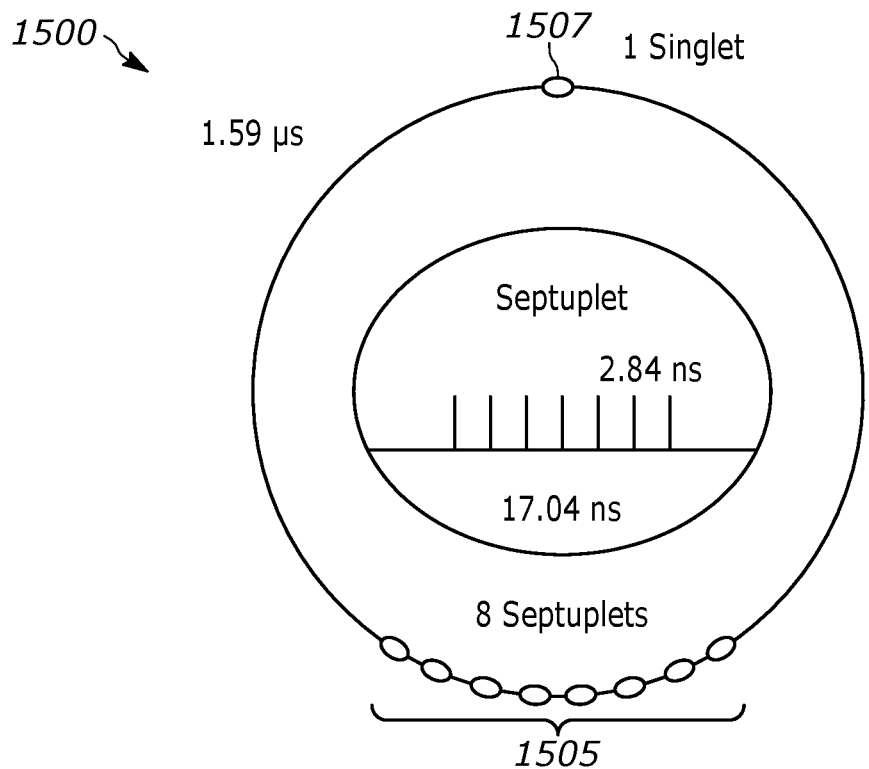
FIG. 15 is an illustration of a synchrotron ring having eight septuplet pulse trains and a singlet pulse during hybrid pulse train operation of the synchrotron ring.

FIG. 15 is an illustration of a synchrotron ring 1500 having eight septuplet pulse trains 1505 and a singlet pulse 1507 during hybrid pulse train operation of the synchrotron ring. A synchrotron such as the Advanced Photon Source at Argonne National Laboratory may be configured to provide such a hybrid pulse train operation. As demonstrated in the following figures, the described methods and system are capable of performing pulse picking of single pulses from a 352 MHz septuplet pulse train. No other current radiation modulation system allows for selection of single pulses from such a high repetition rate pulse train. Further, the disclosed methods demonstrate the tunability to pulse pick, or otherwise modulate, a single pulse, two pulses, three pulses, or more in real time operation without interchanging any physical hardware of the system.

An oscillatory diffractive MEMS device was placed in the beam of the synchrotron 1500 to modulate the radiation and pulses generated by the synchrotron. The delay time of the MEMS device relative to the storage ring was tuned to allow the device to pick any particular x-ray pulse out of the seven pulses of the septuplet pulse train 1505. An electronic delay generator was used to delay a timing signal from the synchrotron 1500 to delay the control timing of the MEMS device. An ultrafast avalanche photodiode (APD) was used to measure radiation diffracted by the oscillatory diffractive MEMS device. The real-time x-ray response of a set of the septuplet pulses was measured by a transiently digitized signal from the ultrafast APD. The measured diffracted radiation confirmed the ability of the described oscillatory diffractive MEMS device to pulse pick a single x-ray pulse from the 352 MHz pulse train.

Figure 16:
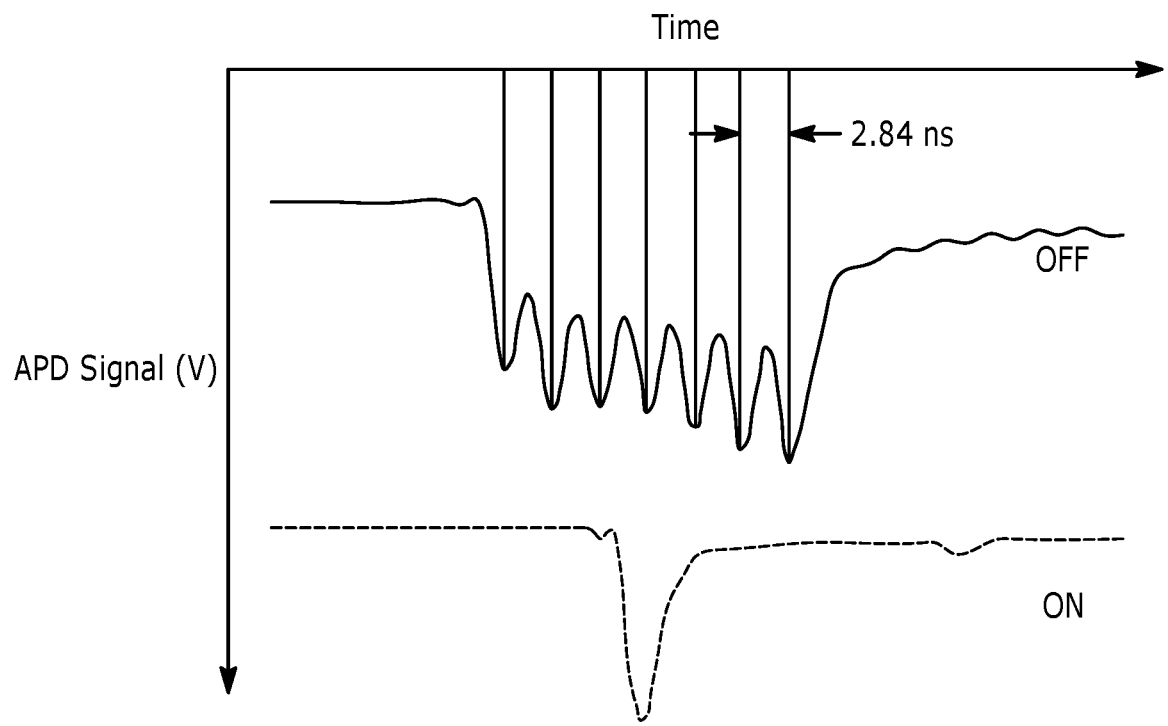
FIG. 16 is a plot of an avalanche photodiode signal showing the detected diffracted pulse from the seven-pulse train at 352 MHz.

The delay time of the MEMS device was tuned to pulse pick the middle, or the fourth, pulse in a seven-pulse train with inter-pulse distances of 2.84 ns. Therefore, for the given pulse train, a time delay of 2.84 ns advances the DTW to the next septuplet pulse in the pulse train 1505. FIG. 16 is a plot of the APD signal showing the detected diffracted pulse from the seven-pulse train at 352 MHz. The DTW of the oscillatory diffractive MEMS device may be detuned so that the width of DTW enables controlled multiple-pulse picking to create more complex temporal structures of the x-ray pulses. For example, the DTW may be tuned to select a single pulse, double pulses, and triple pulses.

Figure 17A:
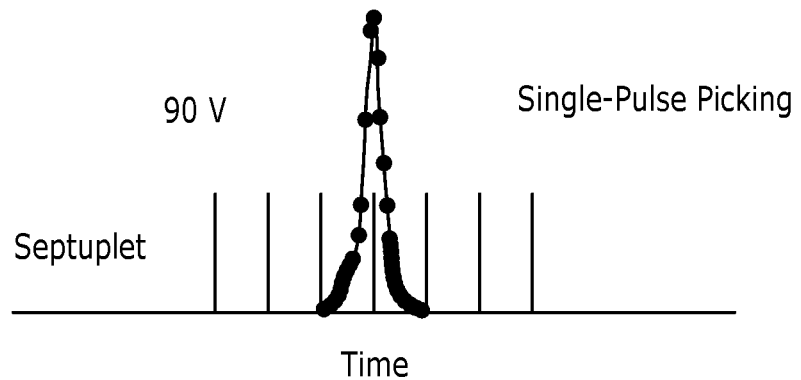
FIG. 17A is a plot of tuned diffraction time window for selecting a single pulse from a pulse train.
Figure 17B:
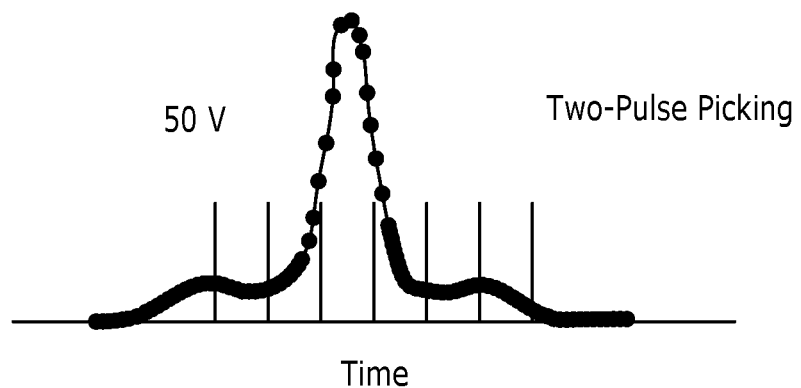
FIG. 17B is a plot of tuned diffraction time window for selecting two pulses from a pulse train.
Figure 17C:
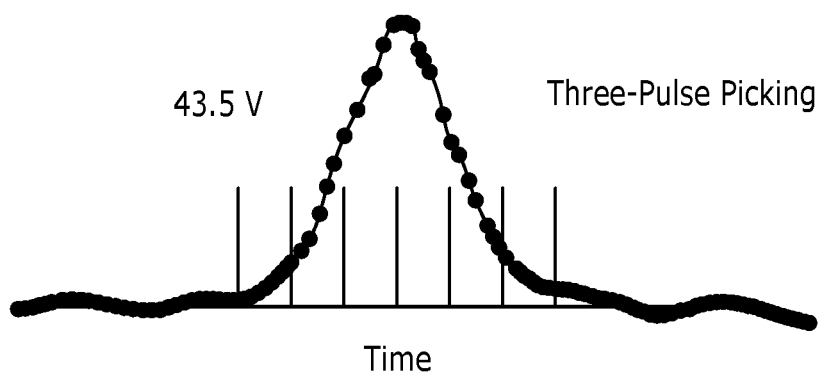
FIG. 17C is a plot of tuned diffraction time window for selecting three pulses from a pulse train.
Figure 18A:
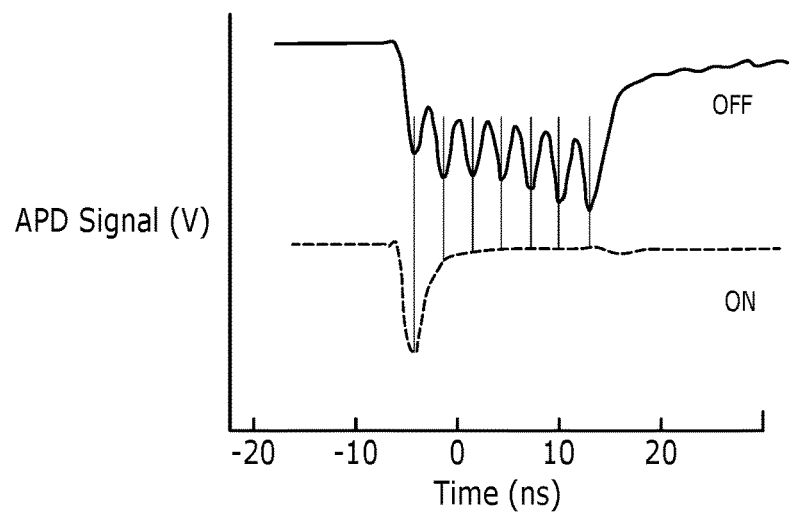
FIG. 18A is an avalanche photodiode signal showing pulse picking of a single pulse from a pulse train.
Figure 18B:
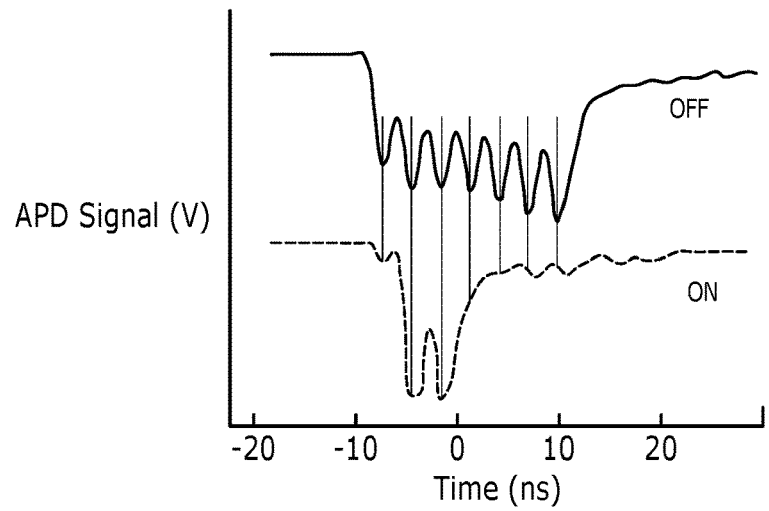
FIG. 18B is an avalanche photodiode signal showing pulse picking of two pulses from a pulse train.
Figure 18C:
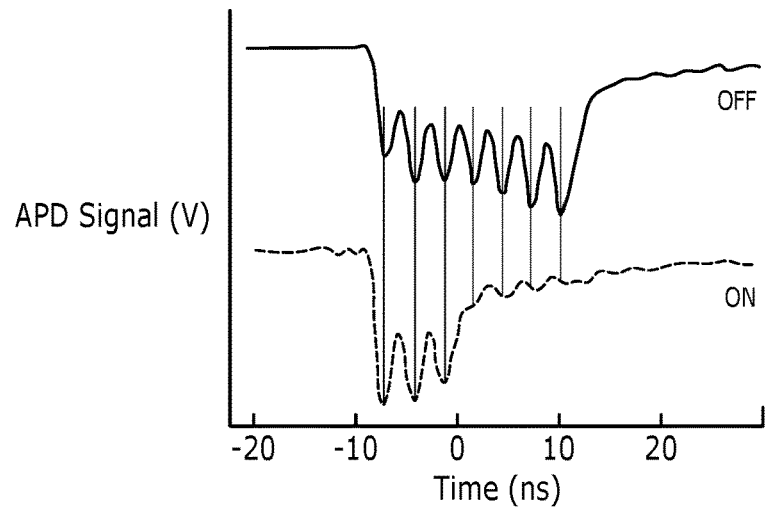
FIG. 18C is an avalanche photodiode signal showing pulse picking of three pulses from a pulse train.

FIGS. 17A, 17B, and 17C are plots of tuned DTW for selecting single, double, and triple pulses respectively, and FIGS. 18A, 18B, and 18C are APD signal voltages of measured diffracted radiation of single, double, and triple pulsing picking respectively. The curves of FIGS. 17A-17C show the total number of counts detected by the APD for a given window or counting interval at different values of delay time which results in the illustrated DTWs. The amplitude of the applied AC voltage signal is decreased from 90 V, to 50 V, to 43.5 V to select the single, double, or triple pulses accordingly. By decreasing the excitation voltage (or increasing the ambient pressure), the oscillation amplitude of MEMS crystal element can be reduced from 20° to 1°, corresponding to a factor of twenty in tuning the width of the DTW from about 1 ns to 20 ns. In the current example, at 90 V the narrow DTW allows only one x-ray pulse to be selected, as shown in FIGS. 17A and 18A. Reducing the excitation voltage to 50 V widens the DTW from 1.0 to 4.4 ns encompassing two adjacent x-ray pulses as shown in FIGS. 17B and 18B. As illustrated in FIGS. 17C and 18C, an excitation voltage of 43.5 V corresponds to a DTW width of 7.2 ns allowing for pulses picking of three consecutive pulses.

Broadening the DTW by voltage amplitude tuning has a low voltage limit. For a given oscillating MEMS device, the voltage must be greater than a minimum required voltage for the oscillating element to oscillate. Below the minimum voltage, the MEMS device will not oscillate. The minimum voltage is dependent on multiple factors such as the number and geometries of the electrode combs, the size and mass of the oscillating element, the stiffness of the material of the oscillating element, among other electrical and mechanical properties. The low voltage limit creates a fundamental limit on the ability to increase the width of the DTW to pulse pick more than 3 or more pulses from a pulse train. Temperature tuning of the MEMS device may be used to further widen the DTW to pulse pick groups of pulses while still providing a driving voltage above the required minimum voltage. As previously discussed in reference to FIGS. 9 and 12, the maximum oscillation angle of the MEMS device may be tuned using temperature. Decreasing the maximum oscillation angle, by increasing the temperature of the MEMS device, broadens the DTW without having to decrease the excitation voltage. Therefore, the temperature of control of the MEMS device provides another parameter by which DTW width can be tuned beyond a fundamental driving voltage limit, as other systems may be limited by.

Figure 19A:
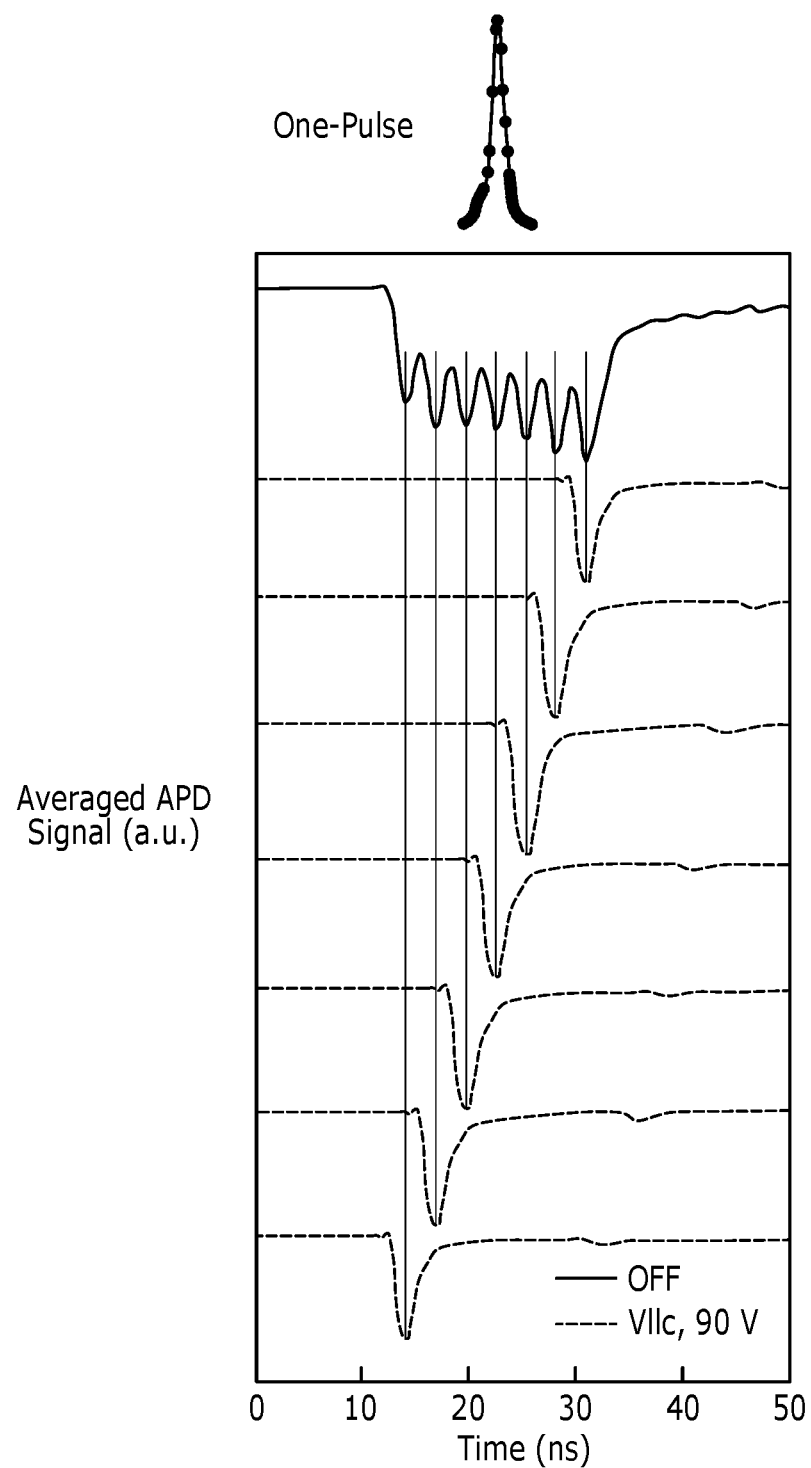
FIG. 19A presents multiple plots of APD signal over time for different DTW delay times illustrating picking different single pulses from a pulse train.
Figure 19B:
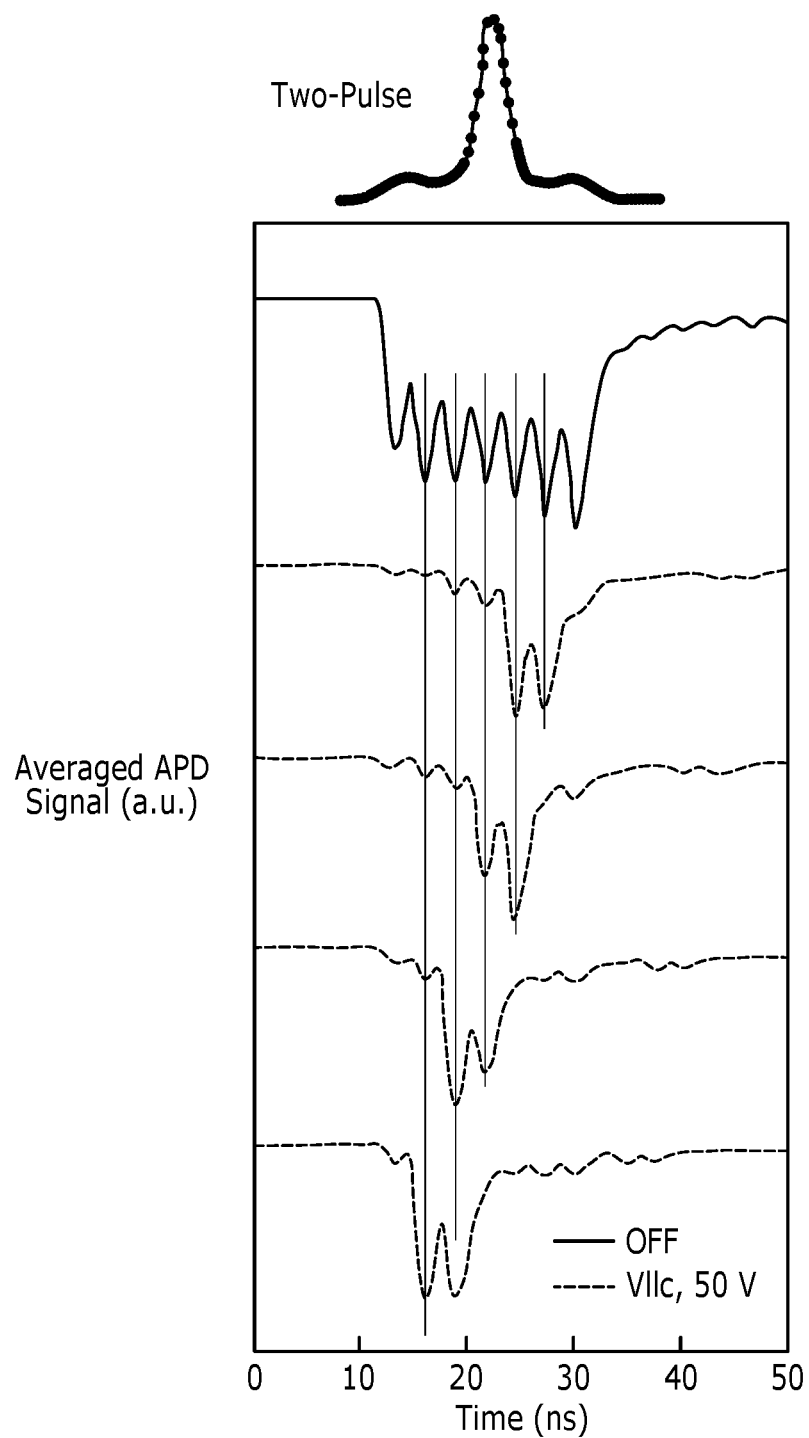
FIG. 19B presents multiple plots of APD signal over time for different DTW delay times illustrating picking different pairs of pulses from a pulse train.
Figure 19C:
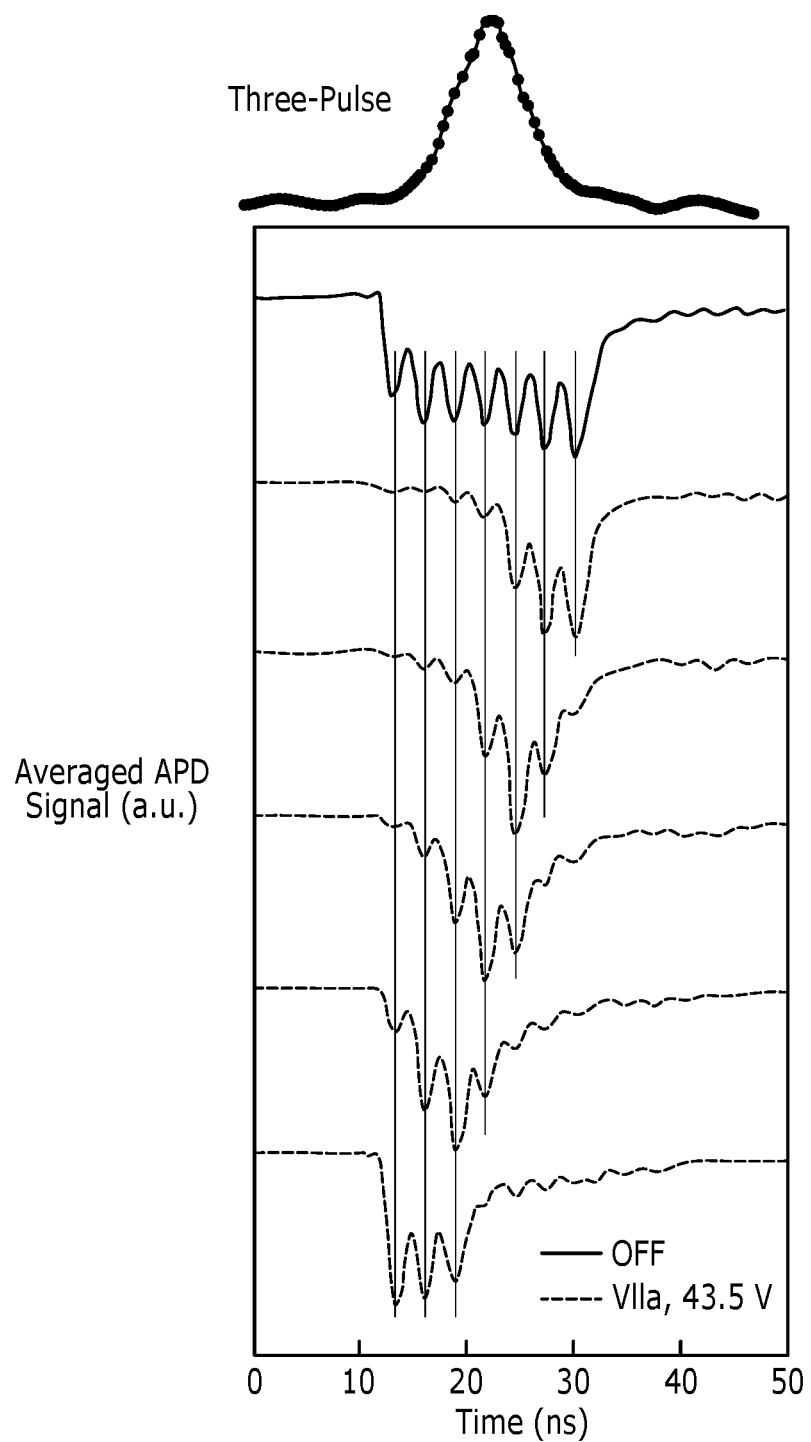
FIG. 19C presents multiple plots of APD signal over time for different DTW delay times illustrating picking different groups of three pulses from a pulse train.

Further, tuning the delay time of the MEMS device varies the phase of the MEMS device enabling the ability to select different pairs of consecutive x-ray pulses in the two-pulse picking case. FIGS. 19A-19C present plots of APD signal over time showing delay time tuning of the DTW for selecting different pulses, and sets of pulses, in the single, double, and triple pulse picking regimes, respectively. The delay time of the DTW may be tuned by altering the electrical delay signal as described above, and further fine-tuning of the delay time may be performed by tuning the temperature of the MEMS device. The temperature tuning allows for delay time control on the order of nanoseconds for ensuring accurate pulse picking to preserve pulse shape and amplitude.

Each of the pulses in FIGS. 18A-18C and 19A-19C is 2.84 ns apart showing that the disclosed MEMS device is capable of picking pulses at pulse rates of greater than 352 MHz. While illustrated as picking between one and three pulses, the DTW can be shifted, widened, or narrowed to pick any number of pulses according to electrical and physical limitations of such an oscillating diffractive MEMS device. The tunable multi-pulse picking capability may be particularly useful in experiments requiring multiple x-ray exposures, for example, experiments and processes used in temporal-spatial correlation measurements of materials dynamics. The changing between pulse-picking operation modes is performed on-the-fly, just by tuning the excitation voltage or ambient pressure and adjusting the operating phase, which does not require any hardware modification. To achieve the same pulse picking functions described above, mechanical choppers and other radiation modulation systems require changes to hardware components including both mechanical and electrical components, which is far more cost- and time-consuming.

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method of spatially modulating radiation, the method comprising: providing an oscillatory diffractive element, the oscillatory diffractive element capable of being oscillated over a range of angles about a central axis of the oscillatory diffractive element; providing radiation onto the oscillatory diffractive element; oscillating the oscillatory diffractive element; modulating the radiation by causing, with the oscillatory diffractive element, diffraction of the radiation at a subset of angles of the range of angles of the oscillatory diffractive element; controlling the temperature of the oscillatory diffractive element to tune the oscillatory motion of the oscillatory diffractive element.

2. The method of aspect 1, wherein tuning the oscillatory motion of the oscillatory diffractive element comprises tuning the range of angles of the oscillatory diffractive element.

3. The method of either aspect 1 or aspect 2, wherein tuning the oscillatory motion of the oscillatory diffractive element comprises tuning a frequency of oscillation of the oscillatory diffractive element.

4. The method of any of aspects 1 to 3, wherein tuning the oscillatory motion of the oscillatory diffractive element comprises tuning a maximum amplitude of oscillation of the oscillatory diffractive element.

5. The method of any of aspects 1 to 4, wherein tuning the oscillatory motion of the oscillatory diffractive element comprises tuning a phase shift of the oscillatory diffractive element.

6. The method of any of aspects 1 to 5, wherein controlling the temperature of the oscillatory diffractive element comprises controlling the temperature by a Peltier device or a resistive heater.

7. The method of any of aspects 1 to 6, wherein controlling the temperature of the oscillatory diffractive element comprises controlling the temperature by a liquid cold plate.

8. A system for performing modulation of radiation, the system comprising: an oscillatory diffractive element disposed along an optical axis, the oscillatory diffractive element having an oscillation axis about which the oscillatory diffractive element may oscillate over a range of angles; an electrode comb physically coupled to the oscillatory diffractive element the electrode, the electrode comb configured to receive a voltage and rotate the oscillatory diffractive element about the oscillation axis upon receiving the voltage; a temperature controller thermally coupled to the oscillatory diffractive element, the temperature controller configured to control a temperature of the oscillatory diffractive element to tune oscillatory motion of the oscillatory diffractive element.

9. The system of aspect 8, wherein to tune the oscillatory motion of the oscillatory diffractive element, the temperature controls the temperature of the oscillatory diffractive element to tune the range of angles of the oscillatory diffractive element.

10. The system of either aspect 8 or aspect 9, wherein to tune the oscillatory motion of the oscillatory diffractive element, the temperature controls the temperature of the oscillatory diffractive element to tune a frequency of oscillation of the oscillatory diffractive element.

11. The system of any of aspects 8 to 10, wherein to tune the oscillatory motion of the oscillatory diffractive element, the temperature controls the temperature of the oscillatory diffractive element to tune a maximum amplitude of oscillation of the oscillatory diffractive element.

12. The system of any of aspects 8 to 11, wherein to tune the oscillatory motion of the oscillatory diffractive element, the temperature controls the temperature of the oscillatory diffractive element to tune a phase shift of the oscillatory diffractive element.

13. The system of any of aspects 8 to 12, wherein the temperature controller comprises a Peltier device.

14. The system of any of aspects 8 to 13, wherein the temperature controller comprises a liquid cold plate.

15. The system of any of aspects 8 to 14, further comprising a radiation source configured to provide radiation to the oscillatory diffractive element.

16. The system of any of aspects 8 to 15, further comprising a vacuum chamber, and wherein the oscillatory diffractive element is disposed inside of the vacuum chamber.

What is claimed is:

1. A method of spatiotemporally modulating radiation, the method comprising:
providing an oscillatory diffractive element, the oscillatory diffractive element capable of being oscillated over a range of angles about a central axis of the oscillatory diffractive element;
providing radiation onto the oscillatory diffractive element;
oscillating the oscillatory diffractive element;
modulating the radiation by causing, with the oscillatory diffractive element, diffraction of the radiation at a subset of angles of the range of angles of the oscillatory diffractive element;
controlling the temperature of the oscillatory diffractive element to tune the oscillatory motion of the oscillatory diffractive element.

2. The method of claim 1, wherein tuning the oscillatory motion of the oscillatory diffractive element comprises tuning the range of angles of the oscillatory diffractive element.

3. The method of claim 1, wherein tuning the oscillatory motion of the oscillatory diffractive element comprises tuning a frequency of oscillation of the oscillatory diffractive element.

4. The method of claim 1, wherein tuning the oscillatory motion of the oscillatory diffractive element comprises tuning a maximum amplitude of oscillation of the oscillatory diffractive element.

5. The method of claim 1, wherein tuning the oscillatory motion of the oscillatory diffractive element comprises tuning a phase shift of the oscillatory diffractive element.

6. The method of claim 1, wherein controlling the temperature of the oscillatory diffractive element comprises controlling the temperature by a Peltier device.

7. The method of claim 1, wherein controlling the temperature of the oscillatory diffractive element comprises controlling the temperature by a liquid cold plate.

8. A system for performing modulation of radiation, the system comprising:
an oscillatory diffractive element disposed along an optical axis, the oscillatory diffractive element having an oscillation axis about which the oscillatory diffractive element may oscillate over a range of angles;
an electrode comb physically coupled to the oscillatory diffractive element, the electrode comb configured to receive a voltage and rotate the oscillatory diffractive element about the oscillation axis upon receiving the voltage;

a temperature controller thermally coupled to the oscillatory diffractive element, the temperature controller configured to control a temperature of the oscillatory diffractive element to tune oscillatory motion of the oscillatory diffractive element.

9. The system of claim 8, wherein to tune the oscillatory motion of the oscillatory diffractive element, the temperature controller controls the temperature of the oscillatory diffractive element to tune the range of angles of the oscillatory diffractive element.

10. The system of claim 8, wherein to tune the oscillatory motion of the oscillatory diffractive element, the temperature controller controls the temperature of the oscillatory diffractive element to tune a frequency of oscillation of the oscillatory diffractive element.

11. The system of claim 8, wherein to tune the oscillatory motion of the oscillatory diffractive element, the temperature controller controls the temperature of the oscillatory diffractive element to tune a maximum amplitude of oscillation of the oscillatory diffractive element.

12. The system of claim 8, wherein to tune the oscillatory motion of the oscillatory diffractive element, the temperature controller controls the temperature of the oscillatory diffractive element to tune a phase shift of the oscillatory diffractive element.

13. The system of claim 8, wherein the temperature controller comprises a Peltier device.

14. The system of claim 8, wherein the temperature controller comprises a liquid cold plate.

15. The system of claim 8, further comprising a radiation source configured to provide radiation to the oscillatory diffractive element.

16. The system of claim 8, further comprising a vacuum chamber, and wherein the oscillatory diffractive element is disposed inside of the vacuum chamber.

\* \* \* \* \*